(12) United States Patent
Kim et al.

(10) Patent No.: US 11,705,306 B2
(45) Date of Patent: Jul. 18, 2023

(54) VARIABLE FREQUENCY AND NON-SINUSOIDAL POWER GENERATOR USING DOUBLE SIDE COOLING, PLASMA PROCESSING APPARATUS INCLUDING THE SAME AND METHOD OF MANUFACTURING SEMICONDUCTOR DEVICE USING THE SAME

(71) Applicant: Samsung Electronics Co., Ltd., Suwon-si (KR)

(72) Inventors: Hyunbae Kim, Yongin-si (KR); Hyunjae Lee, Seongnam-si (KR); Youngdo Kim, Hwaseong-si (KR); Hyejin Kim, Sejong-si (KR); Sangki Nam, Seongnam-si (KR); Chanhee Park, Suwon-si (KR); Minho Jung, Ansan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 70 days.

(21) Appl. No.: 17/470,337

(22) Filed: Sep. 9, 2021

(65) Prior Publication Data

US 2022/0262599 A1 Aug. 18, 2022

(30) Foreign Application Priority Data

Feb. 18, 2021 (KR) ........................ 10-2021-0021626

(51) Int. Cl.
*H01J 37/32* (2006.01)
(52) U.S. Cl.
CPC .. *H01J 37/32174* (2013.01); *H01J 37/32146* (2013.01); *H01J 2237/002* (2013.01)

(58) Field of Classification Search
CPC .......... H01J 37/32174; H01J 37/32146; H01J 2237/002
See application file for complete search history.

(56) References Cited

U.S. PATENT DOCUMENTS

| | | | |
|---|---|---|---|
| 8,368,308 B2 | 2/2013 | Banna et al. |
| 9,685,297 B2 | 6/2017 | Carter et al. |
| 10,424,467 B2 | 9/2019 | Kawasaki |
| 10,679,825 B2 | 6/2020 | Wu et al. |
| 10,790,126 B2 | 9/2020 | Kawasaki |

(Continued)

FOREIGN PATENT DOCUMENTS

| | | |
|---|---|---|
| JP | 2020-0515001 A | 5/2020 |
| KR | 10-0986023 B1 | 1/2005 |

(Continued)

*Primary Examiner* — Henry Luong
(74) *Attorney, Agent, or Firm* — Harness, Dickey & Pierce, P.L.C.

(57) ABSTRACT

A variable frequency and non-sinusoidal power generator includes a pulse module circuit, a slope module circuit, and first and second cooling systems. The pulse module circuit and the slope module circuit includes control switches, and generates at least one of a output currents and a output voltages by selectively turning on/off the control switches based on control signals. The first and second cooling systems are disposed at first and second sides of the control switches. A bias power having a variable frequency and a non-sinusoidal waveform is generated based on the control signals, at least one of the output currents and the output voltages.

20 Claims, 24 Drawing Sheets

(56) References Cited

U.S. PATENT DOCUMENTS

| | | | |
|---|---|---|---|
| 2011/0247995 A1 | 10/2011 | Takahashi et al. | |
| 2014/0062495 A1* | 3/2014 | Carter | G01N 27/06 |
| | | | 324/459 |
| 2020/0227289 A1 | 7/2020 | Song et al. | |

FOREIGN PATENT DOCUMENTS

| | | |
|---|---|---|
| KR | 10-2005-0090904 A | 9/2005 |
| KR | 10-2013-0109540 A | 10/2013 |

* cited by examiner

FIG. 7

| INTERVAL | PULSE MODULE CIRCUIT | | | | SLOPE MODULE CIRCUIT | | | |
|---|---|---|---|---|---|---|---|---|
| | S11~S1N | S21~S2N | S31~S3N | S41~S4N | S51~S5N | S61~S6N | S71~S7N | S81~S8N |
| T1 | OFF | ON | OFF | ON | OFF | ON | OFF | ON |
| T2 | OFF | ON | ON | OFF | OFF | ON | OFF | ON |
| T3 | ON | OFF | ON | OFF | OFF | ON | ON | OFF |
| T4 | ON | OFF | OFF | ON | ON | OFF | ON | OFF |

VARIABLE FREQUENCY AND NON-SINUSOIDAL POWER GENERATOR USING DOUBLE SIDE COOLING, PLASMA PROCESSING APPARATUS INCLUDING THE SAME AND METHOD OF MANUFACTURING SEMICONDUCTOR DEVICE USING THE SAME

CROSS-REFERENCE TO RELATED APPLICATION

This application claims priority under 35 USC § 119 to Korean Patent Application No. 10-2021-0021626 filed on Feb. 18, 2021 in the Korean Intellectual Property Office (KIPO), the contents of which are herein incorporated by reference in their entirety.

BACKGROUND

Some example embodiments relate generally to semiconductor manufacturing processes, and more particularly to variable frequency and non-sinusoidal power generators using double side cooling, plasma processing apparatuses including the variable frequency and non-sinusoidal power generators, and/or methods of manufacturing semiconductor devices using the plasma processing apparatuses.

Various types of semiconductor devices are manufactured using various plasma-based etching techniques. For example, a plasma etching apparatus such as an inductively coupled plasma (ICP) etching apparatus may generate plasma within a chamber to perform an etching process.

Semiconductor manufacturing processes using plasma rely on effective plasma control to achieve desired/requisite quality and/or manufacturing objectives. With a typical plasma based semiconductor process, radio frequency (RF) power of two different frequencies is used to independently control ion energy and plasma density, respectively. In addition, as patterns of semiconductor devices get smaller, uniformity control of the patterns may get more challenging. In order to improve etch uniformity between fine recess patterns in a cell region, a more precise plasma control may be beneficial.

SUMMARY

At least some example embodiments of inventive concepts provide a variable frequency and non-sinusoidal power generator capable of efficiently generating power having a variable frequency and a non-sinusoidal waveform using double side cooling.

Alternatively or additionally, at least some example embodiments of inventive concepts provide a plasma processing apparatus including the variable frequency and non-sinusoidal power generator and capable of efficiently improving plasma characteristics and etching performance.

Alternatively or additionally, at least some example embodiments of inventive concepts provide a method of manufacturing a semiconductor device using the plasma processing apparatus.

According to some example embodiments, a variable frequency and non-sinusoidal power generator includes a pulse module circuitry including a plurality of pulse control switches, and configured to generate at least one first output current or first output voltage, the generating the at least one first output current or first output voltage by selectively turning on and off the plurality of pulse control switches based on a plurality of pulse control signals, at least some of the plurality of pulse control switches being in series, a slope module circuitry including a plurality of slope control switches, and configured to generate at least one second output current or second output voltage, the generating the at least one second output current or second output voltage by selectively turning on and off the plurality of slope control switches based on a plurality of slope control signals, at least some of the plurality of slope control switches being in series, a first cooling system at a first side of the plurality of pulse control switches and the plurality of slope control switches, and a second cooling system at a second side opposite to the first side of the plurality of pulse control switches and the plurality of slope control switches. The variable frequency and non-sinusoidal power generator generates a bias power having a variable frequency and a non-sinusoidal waveform based on the plurality of pulse control signals, the plurality of slope control signals, at least one of the first output current or the first output voltage, and at least one of the second output current or the second output voltage.

According to some example embodiments, a plasma processing apparatus includes a chamber, a substrate stage configured to support a substrate within the chamber, and including a lower electrode, an upper electrode over the lower electrode to face the substrate, a sinusoidal power generator configured to apply a plasma power to the upper electrode to form plasma within the chamber, the plasma power having a sinusoidal waveform, and a variable frequency and non-sinusoidal power generator configured to apply a bias power to the lower electrode, the bias power having a variable frequency and a non-sinusoidal waveform. The variable frequency and non-sinusoidal power generator includes, a pulse module circuitry including a plurality of pulse control switches, and configured to generate at least one of a first output current or a first output voltage by selectively turning on and off the plurality of pulse control switches, the turning on and off the plurality of pulse control switches based on a plurality of pulse control signals, at least some of the plurality of pulse control switches arranged in series, a slope module circuitry including a plurality of slope control switches, and configured to generate at least one of a second output current or a second output voltage by selectively turning on and off the plurality of slope control switches, the turning on and off the plurality of pulse control switches based on a plurality of slope control signals, at least some of the plurality of slope control switches arranged in series, a first cooling system at a first side of the plurality of pulse control switches and the plurality of slope control switches, and a second cooling system at a second side opposite to the first side of the plurality of pulse control switches and the plurality of slope control switches. The variable frequency and non-sinusoidal power generator is configured to generate the bias power based on the plurality of pulse control signals, the plurality of slope control signals, at least one of the first output current and the first output voltage, and at least one of the second output current and the second output voltage.

According to some example embodiments, a variable frequency and non-sinusoidal power generator includes a pulse module circuitry including a first current source and a plurality of pulse control switches, and configured to generate at least one of a first output current or a first output voltage by adjusting an amount of a first input current generated from the first current source based on a first current control signal and by selectively turning on and off the plurality of pulse control switches, the turning on and off the plurality of pulse control switches based on a plurality of pulse control signals, at least some of the plurality of pulse control switches arranged in series, a slope module circuitry including a second current source and a plurality of slope control switches, and configured to generate at least one of a second output current or a second output voltage by adjusting an amount of a second input current generated from the second current source based on a second current control signal and by selectively turning on and off the plurality of slope control switches, the selectively turning on and off the plurality of slope control switches based on a plurality of slope control signals, at least some of the plurality of slope control switches being arranged in series, a control signal generator circuitry configured to generate the first current control signal, the plurality of pulse control signals, the second current control signal, and the plurality of slope control signals, a first cooling system at a first side of the plurality of pulse control switches and the plurality of slope control switches, a second cooling system at a second side opposite to the first side of the plurality of pulse control switches and the plurality of slope control switches, a cold plate including a plurality of fin structures, and arranged between the first cooling system and at least one of the plurality of pulse control switches and the plurality of slope control switches, and a thermal pad between the cold plate and at least one of the plurality of pulse control switches and the plurality of slope control switches. The variable frequency and non-sinusoidal power generator is configured to generate a bias power having a variable frequency and a non-sinusoidal waveform based on the plurality of pulse control signals, the plurality of slope control signals, at least one of the first output current or the first output voltage, and at least one of the second output current or the second output voltage, the bias power has a voltage waveform that repeats every period, and the period includes a pulse interval in which the bias power has a first fixed voltage level that is greater than a reference voltage level, a ramp interval in which the bias power has a first variable voltage level that is less than the reference voltage level and decreases with a constant slope, a first transition interval for changing the pulse interval to the ramp interval, and a second transition interval for changing the ramp interval to the pulse interval.

According to some example embodiments, a method of manufacturing a semiconductor device includes performing plasma processing on a substrate, and fabricating the semiconductor device using the substrate on which the plasma processing is performed. The performing the plasma processing on the substrate includes loading the substrate onto a lower electrode within a chamber, applying, by a sinusoidal power generator, a plasma power to an upper electrode to form plasma within the chamber, the plasma power having a sinusoidal waveform, and applying, by a variable frequency and non-sinusoidal power generator, a bias power to the lower electrode, the bias power having a variable frequency and a non-sinusoidal waveform. The applying the bias power to the lower electrode includes generating at least one of a first output current or a first output voltage by selectively turning on and off a plurality of pulse control switches included in the variable frequency and non-sinusoidal power generator, the selectively turning on and off the plurality of pulse control switches based on a plurality of pulse control signals, generating at least one of a second output current and a second output voltage by selectively turning on and off a plurality of slope control switches included in the variable frequency and non-sinusoidal power generator, the selectively turning on and off the slope control switches based on a plurality of slope control signals, generating the bias power based on at least one of the first output current or the first output voltage, and at least one of the second output current or the second output voltage, and cooling the plurality of pulse control switches and the plurality of slope control switches using a first cooling system and a second cooling system, the first cooling system and the second cooling system included in the variable frequency and non-sinusoidal power generator, the first cooling system at a first side of the plurality of pulse control switches and the plurality of slope control switches, the second cooling system at a second side opposite to the first side of the plurality of pulse control switches and the plurality of slope control switches.

The variable frequency and non-sinusoidal power generator according to some example embodiments may be implemented with a structure for changing the frequency of the bias power having the non-sinusoidal waveform and a structure for reducing the heat generation. For example, to distribute the high voltage and the heat generation, the power elements may be implemented in series and to simultaneously turn on the power elements, the passive balancing scheme may be applied. Alternatively or additionally, to increase the cooling performance, the double side cooling may be applied such that the cooling means are disposed at both sides (e.g., the upper and lower sides) with respect to the power elements. Accordingly, the power having the variable frequency and the non-sinusoidal waveform may be efficiently generated.

The plasma processing apparatus according to some example embodiments may include the variable frequency and non-sinusoidal power generator according to some example embodiments. Thus, the ion energy having a relatively narrow single peak may be formed, the etching profile of the semiconductor device may be improved, and/or bowing or loss of anisotropy may be reduced. Alternatively or additionally, the plasma density in the radial direction of the wafer may be controlled by the frequency change, and thus the etching distribution in the radial direction of the wafer may be controlled. Accordingly, the plasma characteristic and the etching performance may be efficiently improved.

BRIEF DESCRIPTION OF THE DRAWINGS

Illustrative, non-limiting some example embodiments will be more clearly understood from the following detailed description taken in conjunction with the accompanying drawings.

FIG. 7 is a diagram illustrating an operation of a variable frequency and non-sinusoidal power generator of FIG. 6.

DETAILED DESCRIPTION OF SOME EXAMPLE EMBODIMENTS

Figure 1:
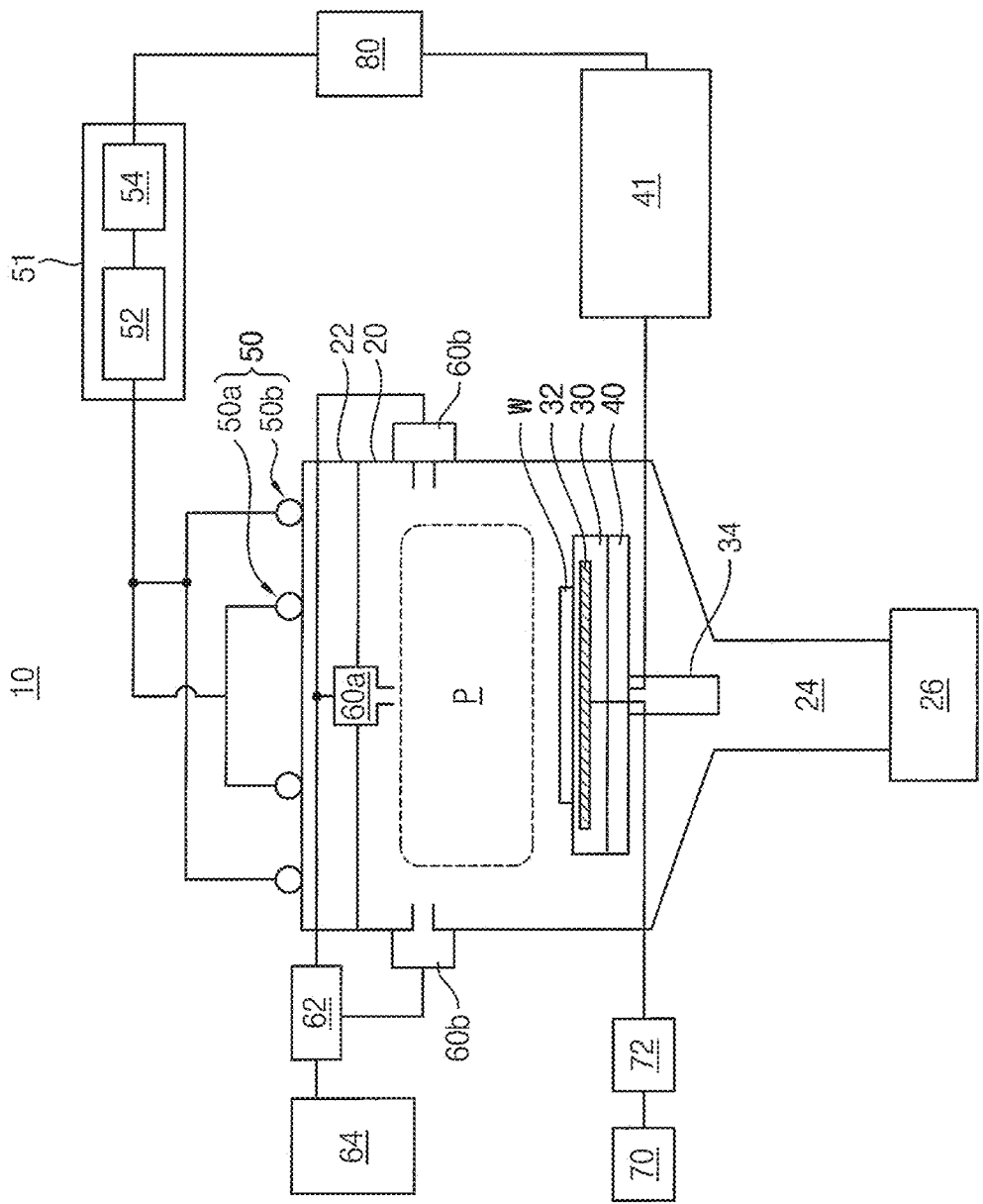
FIG. 1 is a block diagram illustrating a plasma processing apparatus according to some example embodiments.

Various some example embodiments will be described more fully with reference to the accompanying drawings, in which embodiments are shown. Inventive concepts may, however, be embodied in many different forms and should not be construed as limited to the embodiments set forth herein. Like reference numerals refer to like elements throughout this application.

Figure 2:
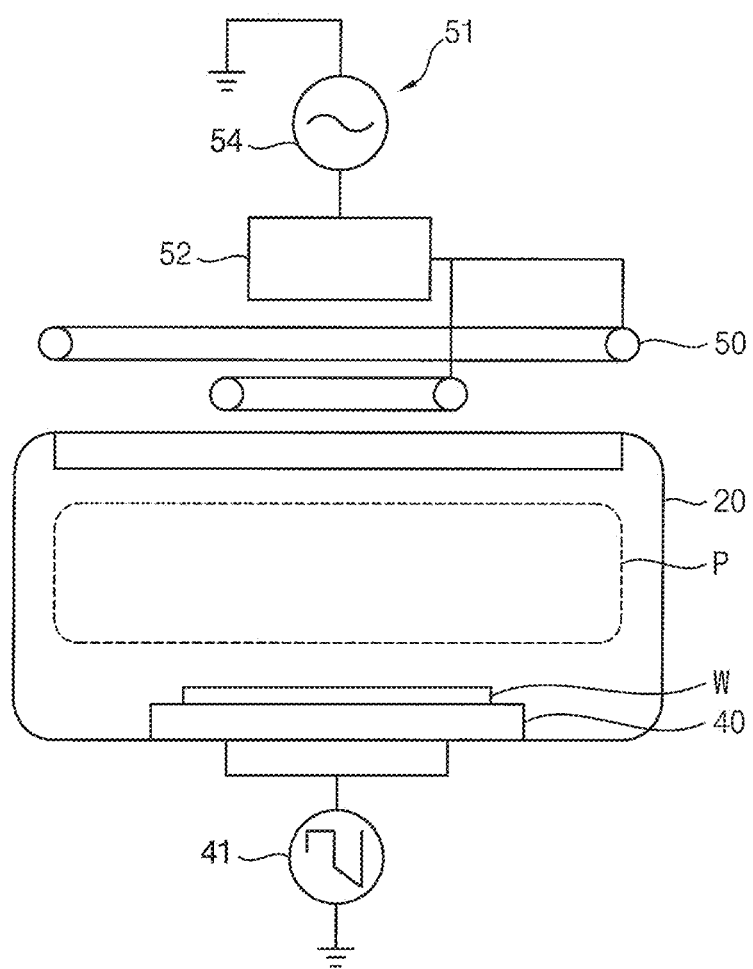
FIG. 2 is a diagram illustrating plasma generated within a chamber of a plasma processing apparatus in FIG. 1.

FIG. 1 is a block diagram illustrating a plasma processing apparatus according to some example embodiments. FIG. 2 is a diagram illustrating plasma generated within a chamber of a plasma processing apparatus in FIG. 1.

Referring to FIGS. 1 and 2, a plasma processing apparatus 10 includes a chamber 20, a chuck or a substrate stage including a lower electrode 40, an upper electrode 50, a sinusoidal power generator 51, a variable frequency and non-sinusoidal power generator 41, and a controller 80. The plasma processing apparatus 10 may further include other components such as a gas supply unit, a gas exhaust unit 26, etc.

In some example embodiments, the plasma processing apparatus 10 may be or may include an inductively coupled plasma (ICP) apparatus configured to etch a layer (e.g., an object layer) on a substrate W such as a semiconductor wafer that is disposed within the chamber 20. However, some example embodiments are not limited thereto, and the plasma processing apparatus 10 may be or may include at least one of a capacitively coupled plasma (CCP) apparatus, a microwave plasma apparatus, etc. For example, plasma such as at least one of ICP, CCP, microwave plasma, etc., may be generated by the plasma processing apparatus 10. For example, the plasma processing apparatus 10 may include one or more of each of or at least two of an ICP chamber, a CCP chamber, and a microwave plasma chamber, which include different components from each other. Alternatively or additionally, the plasma processing apparatus 10 may not be limited to the etching apparatus, and for example, the plasma processing apparatus 10 may be or may include at least one of a deposition apparatus (e.g. a chemical vapor deposition (CVD) apparatus), a cleaning apparatus (e.g. an ashing apparatus), etc. Alternatively or additionally, the substrate W may include a semiconductor substrate such as a wafer, a glass substrate, etc.

The chamber 20 may provide a sealed space where a plasma etching process is performed on the substrate W. For example, the chamber 20 may be or may include a cylindrical vacuum chamber. For example, the chamber 20 may include a metal such as at least one of aluminum, stainless steel, etc.

The substrate stage may be disposed or arranged within the chamber 20 to support the substrate W. For example, the substrate stage may serve as a susceptor for supporting the substrate W thereon. The substrate stage may include a chuck such as an electrostatic chuck 30 for holding the substrate W using electrostatic force. The substrate W may be held on the electrostatic chuck 30 in an adsorptive manner when a direct current (DC) power (e.g., a DC voltage) is applied thereto from a DC power generator 70.

The lower electrode 40 included in the substrate stage may have a circular plate-shape, and the lower electrode 40 may be disposed under the electrostatic chuck 30. The lower electrode 40 may be supported by a driving portion 34 such that the lower electrode 40 may move vertically, e.g. upward and downward. For example, the lower electrode 40 and/or the substrate stage may be moved up and down by the driving arm/driving portion 34. The lower electrode 40 may be referred to as a substrate electrode.

The substrate W may be mounted on an upper surface of the electrostatic chuck 30, and a focus ring (not illustrated) may be installed on the substrate stage to surround the substrate W. The lower electrode 40 may have a diameter greater than a diameter of the substrate W. The lower electrode 40 may have a cooling channel (not illustrated) therein. To increase a control accuracy of a substrate temperature, a heat transfer gas such as a He gas and/or another inert gas may be supplied to a gap between the electrostatic chuck 30 and the substrate W.

A door or gate (not illustrated) for loading and/or unloading the substrate W may be provided in a sidewall of the chamber 20. The substrate W may be loaded/unloaded onto/from the substrate stage through the gate.

A gas exhaust port 24 may be provided in a bottom portion of the chamber 20. The gas exhaust pipe/gas exhaust unit 26 may be connected to the gas exhaust port 24 through a gas exhaust line. The gas exhaust unit 26 may include a vacuum pump such as a turbo-molecular pump and/or the like, to control a pressure of the chamber 20 such that the processing space in the chamber 20 may be depressurized to a desired (or proper or predetermined) vacuum level. Additionally or alternatively, process by-products and/or residual process gases may be discharged through the gas exhaust port 24.

The chamber 20 may include a top or cover 22 covering an upper portion of the chamber 20. The cover 22 may seal the upper portion of the chamber 20 airtight. The upper electrode 50 may be disposed outside the chamber 20 such that the upper electrode 50 faces or opposes the lower electrode 40. The upper electrode 50 may be disposed on the cover 22. The upper electrode 50 may include a radio frequency (RF) antenna. For example, the RF antenna may have a coil shape when viewed in a plan view. For example, the RF antenna may have a spiral shape emanating from a center of an upper surface of the cover 22 and moving farther away as it revolves around the center of the upper surface of the cover 22. The cover 22 may include a circular plate dielectric window. The dielectric window may include a dielectric material. For example, the dielectric window may include alumina ($Al_2O_3$). An electromagnetic signal generated from the sinusoidal power generator 51 may be transferred from the antenna into the chamber 20 through the dielectric window.

For example, the upper electrode 50 may include an inner coil 50a and an outer coil 50b. Either or both of the inner coil 50a and the outer coil 50b may have a spiral shape and/or a concentric shape. The inner coil 50a and the outer coil 50b may generate inductively coupled plasma in a plasma space P of the chamber 20. Although two coils 50a and 50b are described exemplarily, it may be understood that the number, arrangement, etc. of the coils may not be limited thereto, and there may be one coil, or more than two coils.

In some example embodiments, the gas supply unit may include gas supply lines 60a and 60b, a flow controller 62 (e.g. a mass flow controller) and a gas source 64, such as a gas reservoir. For example, the gas supply unit may refer to a set of gas supplying elements. The gas supply lines 60a and 60b may be connected to the upper portion and/or a side portion of the chamber 20 to supply gases into the chamber 20 therethrough. For example, the gas supply lines may include a vertical gas supply line 60a which is connected to the chamber 20 through the cover 22 and a horizontal gas supply line 60b connected to the chamber 20 through the sidewall of the chamber 20. Various gases such as reactive gases and/or inert gases may be supplied into the plasma space P of the chamber 20 through the vertical gas supply line 60a and the horizontal gas supply line 60b.

The gas supply unit may supply different gases having a desired/predetermined mixture ratio. The gas source 64 may store the gases, and the gases may be supplied through a plurality of gas lines connected to the gas supply lines 60a and 60b respectively. The flow controller 62 may control the amount of the gases supplied into the chamber 20 through the gas supply lines 60a and 60b. The flow controller 62 may control independently and/or commonly the amount of the gases supplied to the vertical gas supply line 60a and the horizontal gas supply line 60b respectively. For example, the gas source 64 may include a plurality of gas tanks, and the flow controller 62 may include a plurality of mass flow controllers (MFCs) corresponding to the gas tanks, e.g., respectively connected to the gas tanks; however, example embodiments are not limited thereto. The mass flow controllers may control independently the amount of the gases respectively.

The gas supply unit may supply different process gases into the chamber 20. For example, the process gases may include inert gases such as He and/or N2.

The sinusoidal power generator 51 may apply a plasma power (e.g., a plasma voltage) to the upper electrode 50. The plasma power may have a sinusoidal waveform, e.g. may have a frequency spectrum having a specific, single frequency. The sinusoidal power generator 51 may apply the plasma power to the upper electrode 50 to form the plasma within the chamber 20. The sinusoidal power generator 51 may be referred to as a first power generator and/or a plasma power supply, and the plasma power may be referred to as a plasma source power.

The variable frequency and non-sinusoidal power generator 41 may apply a bias power (e.g., a bias voltage) to the lower electrode 40. The bias power may have a variable frequency and a non-sinusoidal waveform, e.g. may have a frequency spectrum having a plurality of frequencies. The variable frequency and non-sinusoidal power generator 41 may be referred to as a second power generator or a bias power supply, and the bias power may be referred to as a bias source power.

The controller 80 may be connected to the sinusoidal power generator 51 and the variable frequency and non-sinusoidal power generator 41, and may control operations thereof. The controller 80 may be or may include a microcomputer and various interface circuits, and may control an operation of the plasma processing apparatus 10 based on programs and recipe information stored in and/or downloaded from an external or internal memory.

For example, the controller 80 may be or may include a computer (or several interconnected computers) command include, for example, one or more processors configured by software, such as a CPU (Central Processing Unit), controller, etc., forming various functional modules of the computer. The computer may be or may include a general purpose computer or may be dedicated hardware or firmware (e.g., an electronic or optical circuit, such as application-specific hardware, such as, for example, a digital signal processor (DSP) or a field-programmable gate array (FPGA)). A computer may be configured from several interconnected computers. Each functional module (or unit) described herein may comprise a separate computer, or some or all of the functional module (or unit) may be comprised of and share the hardware of the same computer. Connections and interactions between the units described herein may be hardwired and/or in the form of data (e.g., as data stored in and retrieved from memory of the computer, such as a register, buffer, cache, storage drive, etc., such as part of an application programming interface (API)). As is understood, "software" refers to prescribed rules to operate a computer, such as code or script.

For example, the sinusoidal power generator 51 may include an RF power source 54 and an RF matcher 52 as plasma source elements. The RF power source 54 may generate an RF signal. The RF matcher 52 may match an impedance of the RF signal generated from the RF power source 54 using the coils 50a and 50b to control generation of the plasma.

The sinusoidal power generator 51 may apply a RF power signal (e.g., the plasma power) to the upper electrode 50 based on a plasma power control signal provided from the controller 80. For example, the RF power signal may be generated to have a frequency range of about 13 MHz to about 2.45 GHz, and may be generated to have an RF power range of about 100 W to about 1000 W.

As the RF power signal having a specific (or, predetermined) frequency (e.g., 13.56 MHz) is applied to the upper electrode 50, an electromagnetic field induced by the upper electrode 50 may be applied to a source gas supplied within the chamber 20 to generate the plasma.

The variable frequency and non-sinusoidal power generator 41 may apply a bias power signal (e.g., the bias power) to the lower electrode 40 based on a bias power control signal provided from the controller 80. The variable frequency and non-sinusoidal power generator 41 may apply the bias power signal having a desired frequency and a desired non-sinusoidal voltage waveform to the lower electrode 40.

The frequency and the voltage waveform of the bias power signal applied by the variable frequency and non-sinusoidal power generator 41 may be controlled such that a desired/predetermined voltage and a desired/predetermined ion energy distribution may be generated on or near a surface of a substrate W and a desired/predetermined ion flux and a desired/predetermined etching rate may be obtained. Detailed configurations and operations of the variable frequency and non-sinusoidal power generator 41 will be described later.

In some example embodiments, the plasma processing apparatus 10 may include a temperature control device, e.g. within the substrate stage. The temperature control device may include a heater and/or a cooler. For example, the temperature control device may include a heater 32 within the electrostatic chuck 30 to control a temperature of the electrostatic chuck 30, a heater power supply 70 configured to supply a power to the heater 32, and a filter 72 disposed between the heater 32 and the heater power supply 70.

In some example embodiments, the plasma processing apparatus 10 may further include a sinusoidal power generator for applying a bias power having a sinusoidal waveform to the lower electrode 40, and a switching circuit for simultaneously or selectively applying the bias power having the sinusoidal waveform and the bias power having the non-sinusoidal waveform.

Figure 3:
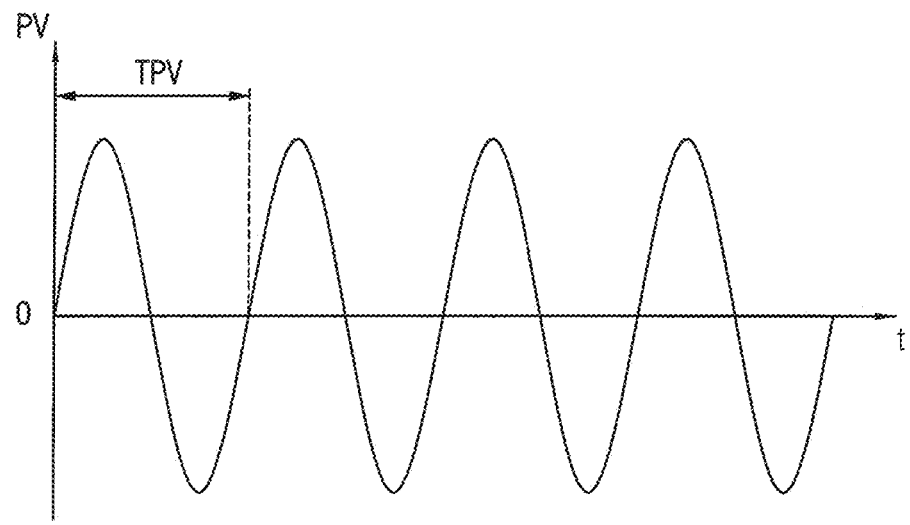
FIG. 3 is a waveform diagram illustrating a plasma power generated from a sinusoidal power generator of a plasma processing apparatus according to some example embodiments.

FIG. 3 is a waveform diagram illustrating a plasma power generated from a sinusoidal power generator of a plasma processing apparatus according to some example embodiments.

Referring to FIG. 3, a plasma power (or plasma voltage) PV may have a sinusoidal waveform. For example, the plasma power PV may have a voltage waveform of a sinusoidal wave that is repeated every specific/predetermined period TPV, and may have a frequency corresponding to the period TPV. For example, the plasma power PV may have or operate with a fixed frequency or significantly fixed frequency.

Figure 4:
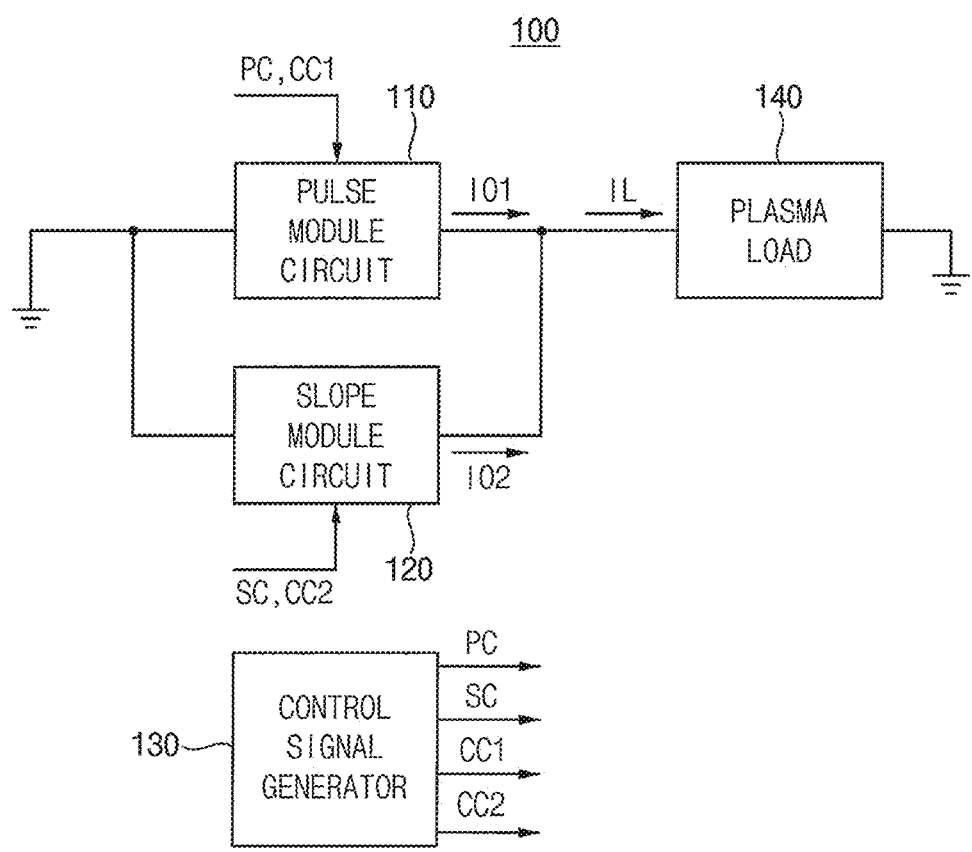
FIG. 4 is a block diagram illustrating a variable frequency and non-sinusoidal power generator according to some example embodiments.

FIG. 4 is a block diagram illustrating a variable frequency and non-sinusoidal power generator according to some example embodiments.

Referring to FIG. 4, a variable frequency and non-sinusoidal power generator 100 includes a pulse module circuit 110 and a slope module circuit 120. The variable frequency and non-sinusoidal power generator 100 may further include a control signal generator 130 and/or a plasma load 140.

The pulse module circuit 110 may generate a first output current IO1 based on a plurality of pulse control signals PC and on a first current control signal CC1. For example, the pulse module circuit 110 may include a plurality of pulse control switches (or power elements), and one or more of the plurality of pulse control switches may be arranged in series. The pulse module circuit 110 may generate the first output current IO1 by selectively turning on and off the plurality of pulse control switches based on the plurality of pulse control signals PC. The amount of the first output current IO1 may be changed or adjusted based on the plurality of pulse control signals PC and the first current control signal CC1. Alternatively or additionally, the pulse module circuit 110 may generate a first output voltage corresponding to the first output current IO1, or may generate both the first output current IO1 and the first output voltage. For example, the pulse module circuit 110 may generate at least one of the first output current IO1 and the first output voltage.

In some example embodiments, the pulse module circuit 110 may include a high current source that generates a relatively large amount of input current (or source current), may be implemented using series-connected switches of a half bridge structure, and may generate a pulse voltage having a rectangular waveform by generating positive and negative currents. The rectangular waveform may have a duty ratio of one-to-one; however, example embodiments are not limited thereto, and the duty ratio of the rectangular waveform may not be one-to-one.

The slope module circuit 120 may generate a second output current IO2 based on a plurality of slope control signals SC and a second current control signal CC2. For example, the slope module circuit 120 may include a plurality of slope control switches, and at least some of the plurality of slope control switches may be arranged in series. The slope module circuit 120 may generate the second output current IO2 by selectively turning on and off the plurality of slope control switches based on the plurality of slope control signals SC. The amount of the second output current IO2 may be changed based on the plurality of slope control signals SC and the second current control signal CC2. Alternatively or additionally, the slope module circuit 120 may generate a second output voltage corresponding to the second output current IO2, or may generate both the second output current IO2 and the second output voltage. For example, the slope module circuit 120 may generate at least one of the second output current IO2 and the second output voltage.

In some example embodiments, the slope module circuit 120 may include a low current source that generates a relatively small amount of input current (or source current), may be implemented using series-connected switches of a half bridge structure similar to the pulse module circuit 110, and may generate a slope voltage (e.g., a voltage that partially overlaps a negative voltage having a rectangular waveform and has a negative slope) by generating positive and negative currents. The rectangular waveform may have a duty-ratio of one-to-one; however, example embodiments are not limited thereto.

Detailed configurations of operations of the pulse module circuit 110 and the slope module circuit 120 will be described with reference to FIGS. 6 and 7.

The plasma load 140 may be connected to outputs of the pulse module circuit 110 and the slope module circuit 120, may receive a load current IL corresponding to the sum of the first and second output currents IO1 and IO2, and may generate a bias power (e.g., a bias power BV in FIG. 5) based on the load current IL. For example, the plasma load 140 may be modeled as a circuit including at least one resistor and at least one capacitor in series and/or parallel with the at least one resistor, and may generate a voltage (e.g., the bias power BV) by applying a current (e.g., the load current IL).

As described above, at least one of the first output current IO1 and the first output voltage may be generated and at least one of the second output current IO2 and the second output voltage may be generated based on the plurality of pulse control signals PC, the plurality of slope control signals SC, and the first and second current control signals CC1 and CC2. Alternatively or additionally, the bias power BV having a variable frequency and a non-sinusoidal waveform may be generated based on at least one of the first output current IO1 and the first output voltage, and at least one of the second output current IO2 and the second output voltage (e.g., based on the load current IL).

The control signal generator 130 may generate the plurality of pulse control signals PC, the plurality of slope control signals SC, and the first and second current control signals CC1 and CC2. In some example embodiments, the control signal generator 130 may be disposed outside the variable frequency and non-sinusoidal power generator 100 (e.g., disposed in the controller 80 of FIG. 1).

In some example embodiments, the control signal generator 130 may change or adjust the frequency of the bias power BV based on the plurality of pulse control signals PC and the plurality of slope control signals SC. For example, the control signal generator 130 may adjust at least one of turn-on times, turn-off times and/or switching timings (or switching speeds) of the plurality of pulse control switches and the plurality of slope control switches by controlling time intervals in which the plurality of pulse control signals PC and the plurality of slope control signals SC have high levels and low levels, and thus may change the frequency of the bias power BV based thereon.

As described above, as the frequency of the bias power BV is changed (e.g., increased), the amount of heat generated and/or emitted from the pulse module circuit 110 and the slope module circuit 120 (e.g., from the plurality of pulse control switches and the plurality of slope control switches) may increase. Therefore, the variable frequency and non-sinusoidal power generator 100 may include a cooling system or cooling means for controlling heat generation, and for example, may include first and second cooling systems or cooling means implemented by double sided cooling. Configurations of the first and second cooling means will be described with reference to FIGS. 8, 9 and 10.

Figure 5:
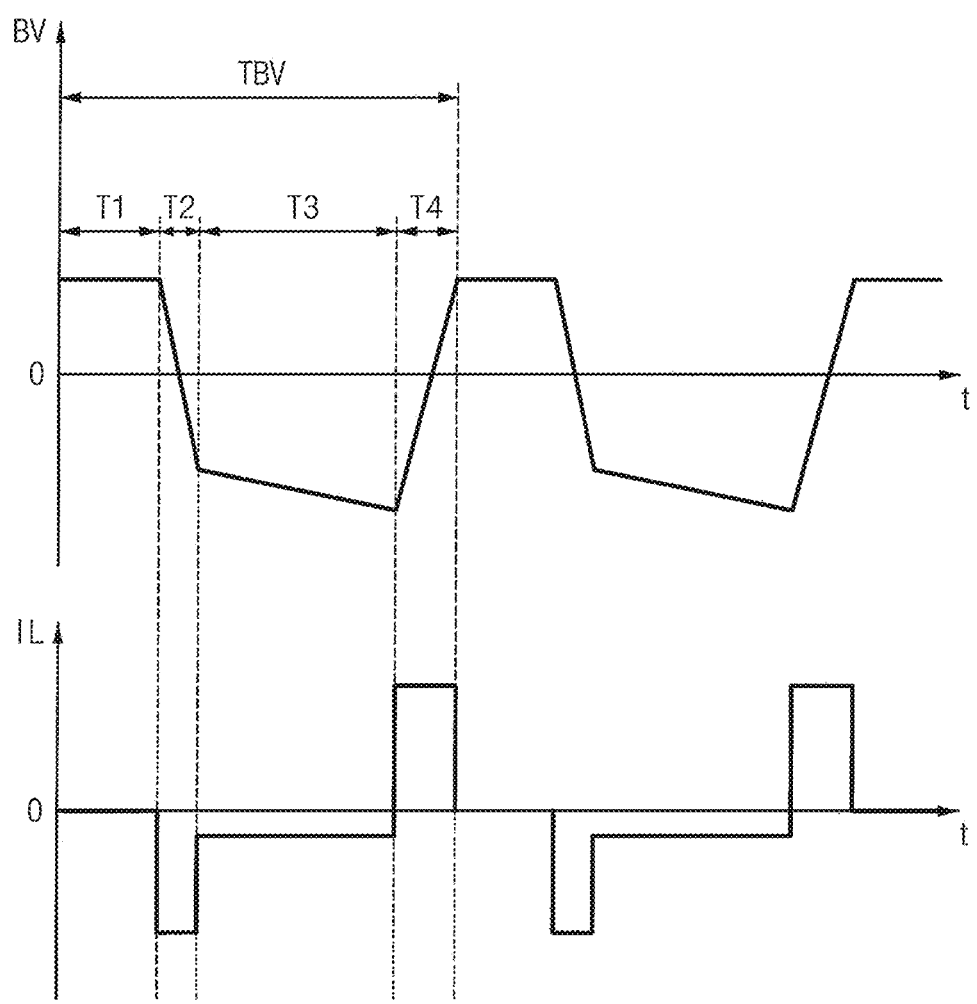
FIG. 5 is a waveform diagram illustrating a bias power generated from a variable frequency and non-sinusoidal power generator according to some example embodiments.

FIG. 5 is a waveform diagram illustrating a bias power generated from a variable frequency and non-sinusoidal power generator according to some example embodiments.

Referring to FIG. 5, the bias power (or bias voltage) BV may be generated based on the load current IL, and may have a non-sinusoidal waveform. For example, the bias power BV may have a voltage waveform of a non-sinusoidal wave that is repeated every specific or predetermined period TBV.

The period TBV of the bias power BV may include a pulse interval T1, a first transition interval T2, a ramp down or ramp interval T3, and a second transition interval T4. The pulse interval T1 may represent a time interval in which the bias power BV has a fixed voltage level higher than or greater than a reference voltage level (e.g., about 0V). The ramp interval T3 may represent a time interval in which the bias power BV has a variable voltage level that is lower than or less than the reference voltage level and decreases with a constant slope. The first transition interval T2 may be for changing the pulse interval T1 to the ramp interval T3, may be disposed between or occur between the pulse interval T1 and the ramp interval T3, and may represent a time interval the bias power BV is transitioned from a positive voltage level to a negative voltage level. The second transition interval T4 may be for changing the ramp interval T3 to the pulse interval T1, may be disposed between or occur between the ramp interval T3 and the pulse interval T1, and may represent a time interval the bias power BV is transitioned from a negative voltage level to a positive voltage level.

The bias power BV may have a frequency, e.g. a fundamental frequency, corresponding to the period TBV, and the frequency of the bias power BV may be changed or adjusted. For example, the frequency of the bias power BV may be changed by adjusting lengths of the pulse interval T1, the first transition interval T2, the ramp interval T3 and the second transition interval T4 based on the plurality of pulse control signals PC and the plurality of slope control signals SC. For example, the frequency of the bias power BV may be changed in a range of about 100 kHz to about 800 kHz. However, example embodiments are not limited thereto, and the frequency of the bias power supply BV may be changed in a range of about 1 kHz to about 10 MHz.

In some example embodiments, the lengths of the first transition interval T2 and the second transition interval T4 may be very short compared to the lengths of the pulse interval T1 and the ramp interval T3, e.g. may be one or more orders of magnitude shorter compared to the lengths of the pulse interval T1 and the ramp interval T3. For convenience of illustration, the first transition interval T2 and the second transition interval T4 may be omitted in subsequent figures such as FIG. 11A.

Figure 6:
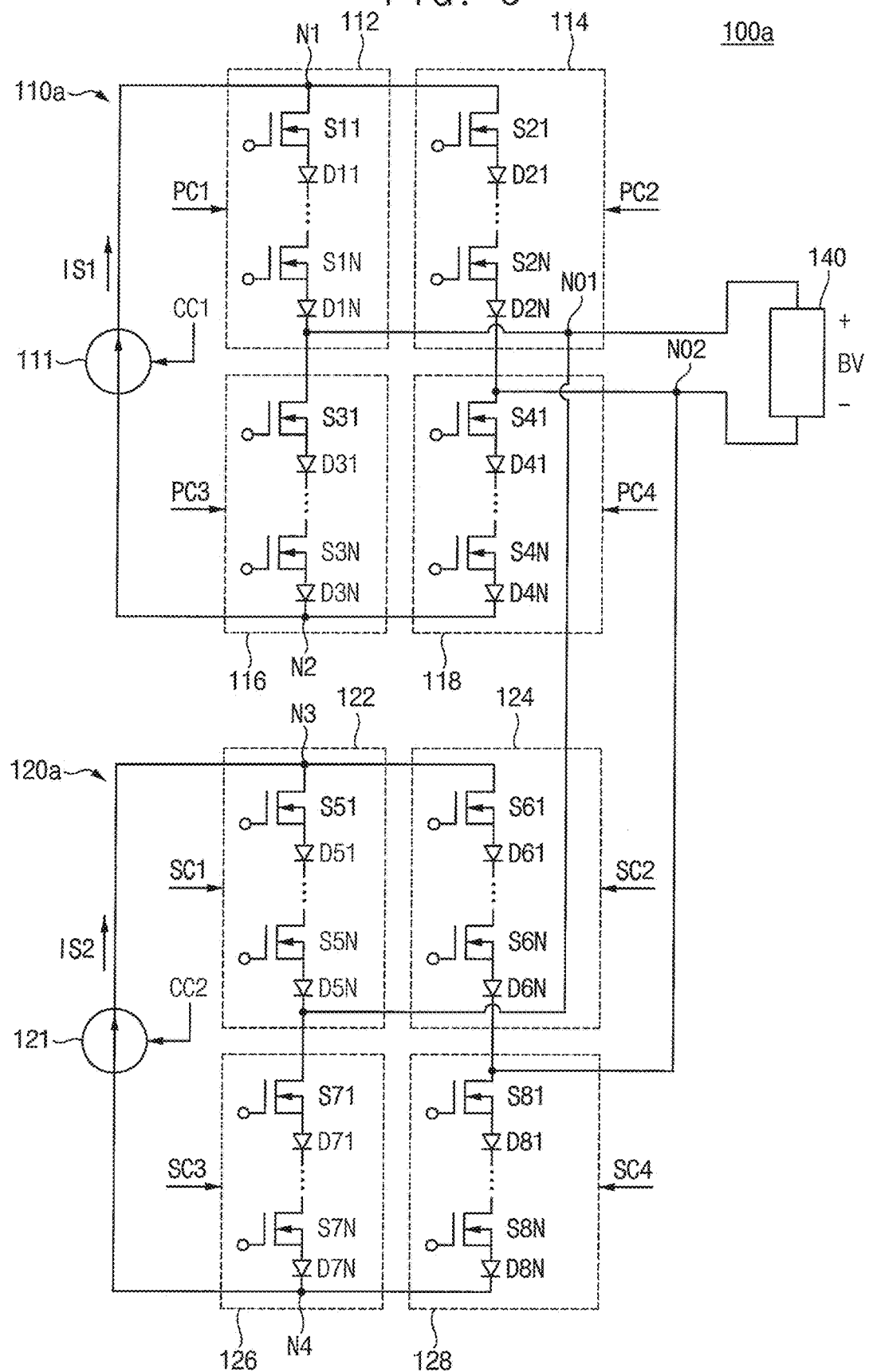
FIG. 6 is a circuit diagram illustrating an example of a variable frequency and non-sinusoidal power generator of FIG. 4.

FIG. 6 is a circuit diagram illustrating an example of a variable frequency and non-sinusoidal power generator of FIG. 4. The descriptions repeated with FIG. 4 will be omitted for brevity.

Referring to FIG. 6, a variable frequency and non-sinusoidal power generator 100a includes a pulse module circuit 110a and a slope module circuit 120a. The variable frequency and non-sinusoidal power generator 100a may further include the plasma load 140. For convenience of illustration, the control signal generator 130 is omitted in FIG. 6.

The plasma load 140 may be connected between a first output node NO1 and a second output node NO2, and may generate the bias power BV based on the load current IL provided from the pulse module circuit 110a and the slope module circuit 120a.

The pulse module circuit 110a may include a first current source 111, a first control circuit 112, a second control circuit 114, a third control circuit 116 and a fourth control circuit 118.

The first current source 111 may be connected between a first node N1 and a second node N2, and may generate a first input current IS1. At least one of the first output current IO1 and the first output voltage may be generated based on the first input current IS1. Alternatively or additionally, the first current source 111 may change the amount of the first input current IS1 based on the first current control signal CC1. When the amount of the first input current IS1 is changed, the fixed voltage level of the bias power BV in the pulse interval T1 and the variable voltage level of the bias power BV in the ramp interval T3 may be changed, and thus an amplitude of the bias power BV may be changed.

The first control circuit 112 may be connected between the first node N1 and the first output node NO1, and may include first switches S11, . . . , S1N and first diodes D11, . . . , D1N, where N is a natural number greater than or equal to two. The first switches S11, . . . , S1N may be turned on and off based on a first pulse control signal PC1. The first switches S11, . . . , S1N and the first diodes D11, . . . , D1N may be alternately disposed between the first node N1 and the first output node NO1, and may be connected in series. For example, the first switch S11, the first diode D11, . . . , the first switch S1N and the first diode D1N may be sequentially disposed and connected.

Each of the second control circuit 114, the third control circuit 116 and the fourth control circuit 118 may have a configuration or topology or network similar to that of the first control circuit 112.

For example, the second control circuit 114 may be connected between the first node N1 and the second output node NO2, and may include second switches S21, . . . , S2N and second diodes D21, . . . , D2N. The second switches S21, . . . , S2N may be turned on and off based on a second pulse control signal PC2. The second switches S21, . . . , S2N and the second diodes D21, . . . , D2N may be alternately disposed between the first node N1 and the second output node NO2, and may be connected in series.

The third control circuit 116 may be connected between the first output node NO1 and the second node N2, and may include third switches S31, . . . , S3N and third diodes D31, . . . , D3N. The third switches S31, . . . , S3N may be turned on and off based on a third pulse control signal PC3. The third switches S31, . . . , S3N and the third diodes D31, ..., D3N may be alternately disposed between the first output node NO1 and the second node N2, and may be connected in series.

The fourth control circuit 118 may be connected between the second output node NO2 and the second node N2, and may include fourth switches S41, ..., S4N and fourth diodes D41, ..., D4N. The fourth switches S41, ..., S4N may be turned on and off based on a fourth pulse control signal PC4. The fourth switches S41, ..., S4N and the fourth diodes D41, ..., D4N may be alternately disposed between the second output node NO2 and the second node N2, and may be connected in series.

The first switches S11, ..., S1N, the second switches S21, ..., S2N, the third switches S31, ..., S3N and the fourth switches S41, ..., S4N may correspond to the plurality of pulse control switches described with reference to FIG. 4. The first pulse control signal PC1, the second pulse control signal PC2, the third pulse control signal PC3 and the fourth pulse control signal PC4 may correspond to the plurality of pulse control signals PC described with reference to FIG. 4.

The slope module circuit 120a may include a second current source 121, a fifth control circuit 122, a sixth control circuit 124, a seventh control circuit 126 and an eighth control circuit 128. The slope module circuit 120a may have a configuration or topology or network similar to that of the pulse module circuit 110a.

The second current source 121 may be connected between a third node N3 and a fourth node N4, and may generate a second input current IS2. At least one of the second output current IO2 and the second output voltage may be generated based on the second input current IS2. In addition, the second current source 121 may change the amount of the second input current IS2 based on the second current control signal CC2. When the amount of the second input current IS2 is changed, the slope of the variable voltage level of the bias power BV in the ramp interval T3 may be changed.

In some example embodiments, the amount of the first input current IS1 may be greater than the amount of the second input current IS2. As illustrated in FIG. 5, the amount of the first input current IS1 may be relatively large such that the amount of the load current IL having a negative current level is relatively large during the first transition interval T2 and the amount of the load current IL having a positive current level is relatively large during the second transition interval T4. Alternatively or additionally, the amount of the second input current IS2 may be relatively small such that the amount of the load current IL having a negative current level is relatively small during the ramp interval T3.

The fifth control circuit 122 may be connected between the third node N3 and the first output node NO1, and may include fifth switches S51, ..., S5N and fifth diodes D51, ..., D5N. The fifth switches S51, ..., S5N may be turned on and off based on a first slope control signal SC1. The fifth switches S51, ..., S5N and the fifth diodes D51, ..., D5N may be alternately disposed between the third node N3 and the first output node NO1, and may be connected in series.

Each of the sixth control circuit 124, the seventh control circuit 126 and the eighth control circuit 128 may have a configuration or topology or network similar to that of the fifth control circuit 122.

For example, the sixth control circuit 124 may be connected between the third node N3 and the second output node NO2, and may include sixth switches S61, ..., S6N and sixth diodes D61, ..., D6N. The sixth switches S61, ..., S6N may be turned on and off based on a second slope control signal SC2. The sixth switches S61, ..., S6N and the sixth diodes D61, ..., D6N may be alternately disposed between the third node N3 and the second output node NO2, and may be connected in series.

The seventh control circuit 126 may be connected between the first output node NO1 and the fourth node N4, and may include seventh switches S71, ..., S7N and seventh diodes D71, ..., D7N. The seventh switches S71, ..., S7N may be turned on and off based on a third slope control signal SC3. The seventh switches S71, ..., S7N and the seventh diodes D71, ..., D7N may be alternately disposed between the first output node NO1 and the fourth node N4, and may be connected in series.

The eighth control circuit 128 may be connected between the second output node NO2 and the fourth node N4, and may include eighth switches S81, S8N and eighth diodes D81, D8N. The eighth switches S81, S8N may be turned on and off based on a fourth slope control signal SC4. The eighth switches S81, S8N and the eighth diodes D81, ..., D8N may be alternately disposed between the second output node NO2 and the fourth node N4, and may be connected in series.

The fifth switches S51, ..., S5N, the sixth switches S61, S6N, the seventh switches S71, ..., S7N and the eighth switches S81, S8N may correspond to the plurality of slope control switches described with reference to FIG. 4. The first slope control signal SC1, the second slope control signal SC2, the third slope control signal SC3 and the fourth slope control signal SC4 may correspond to the plurality of slope control signals SC described with reference to FIG. 4.

In some example embodiments, each of or any of the switches S11 to S1N, S21 to S2N, S31 to S3N, S41 to S4N, S51 to S5N, S61 to S6N, S71 to S7N and S81 to S8N may include any transistor such as at least one of a metal oxide semiconductor field effect transistor (MOSFET), an insulated gate bipolar transistor (IGBT), a thyristor, a gate turn-off thyristor (GTO), and/or the like, and each of the control signals PC1 to PC4 and SC1 to SC4 may be applied to a gate electrode of the transistor. The switches S11 to S1N, S21 to S2N, S31 to S3N, S41 to S4N, S51 to S5N, S61 to S6N, S71 to S7N and S81 to S8N may be transistors of the same or similar type or structure; however, example embodiments are not limited thereto. For example, at least one of the switches S11 to S1N, S21 to S2N, S31 to S3N, S41 to S4N, S51 to S5N, S61 to S6N, S71 to S7N and S81 to S8N may have a different threshold voltage and/or a different channel width and/or a different oxide thickness than others of the switches S11 to S1N, S21 to S2N, S31 to S3N, S41 to S4N, S51 to S5N, S61 to S6N, S71 to S7N and S81 to S8N.

FIG. 7 is a diagram illustrating an operation of a variable frequency and non-sinusoidal power generator of FIG. 6.

Referring to FIG. 7, the switches included in one control circuit of the pulse module circuit 110a and the slope module circuit 120a may be simultaneously switched or turned on and off. The load current IL and the bias power BV in FIG. 5 may be generated by performing switching operations by the switches S11 to S1N, S21 to S2N, S31 to S3N, S41 to S4N, S51 to S5N, S61 to S6N, S71 to S7N and S81 to S8N, as illustrated by a table in FIG. 7.

For example, during the pulse interval T1, the second switches S21 to S2N, the fourth switches S41 to S4N, the sixth switches S61 to S6N, and the eighth switches S81 to S8N may be simultaneously turned on, and the first switches S11 to S1N, the third switches S31 to S3N, the fifth switches S51 to S5N, and the seventh switches S71 to S7N may be simultaneously turned off, based on the control signals PC1 to PC4 and SC1 to SC4.

During the first transition interval T2, the second switches S21 to S2N, the third switches S31 to S3N, the sixth switches S61 to S6N, and the eighth switches S81 to S8N may be simultaneously turned on, and the first switches S11 to S1N, the fourth switches S41 to S4N, the fifth switches S51 to S5N, and the seventh switches S71 to S7N may be simultaneously turned off, based on the control signals PC1 to PC4 and SC1 to SC4.

During the ramp interval T3, the first switches S11 to S1N, the third switches S31 to S3N, the sixth switches S61 to S6N, and the seventh switches S71 to S7N may be simultaneously turned on, and the second switches S21 to S2N, the fourth switches S41 to S4N, the fifth switches S51 to S5N, and the eighth switches S81 to S8N may be simultaneously turned off, based on the control signals PC1 to PC4 and SC1 to SC4.

During the second transition interval T4, the first switches S11 to S1N, the fourth switches S41 to S4N, the fifth switches S51 to S5N, and the seventh switches S71 to S7N may be simultaneously turned on, and the second switches S21 to S2N, the third switches S31 to S3N, the sixth switches S61 to S6N, and the eighth switches S81 to S8N may be simultaneously turned off, based on the control signals PC1 to PC4 and SC1 to SC4.

As described above, the frequency of the bias power BV may be changed by adjusting the lengths of the pulse interval T1, the first transition interval T2, the ramp interval T3 and the second transition interval T4 based on the control signals PC1 to PC4 and SC1 to SC4.

The variable frequency and non-sinusoidal power generator according to some example embodiments may be implemented and may operate as illustrated in FIGS. 4, 5, 6 and 7. Since the variable frequency and non-sinusoidal power generator has a circuit structure for waveform and/or frequency tuning, a relatively narrow ion energy distribution may be formed, and an etching distribution in a radial direction of a wafer may be controlled. Alternatively or additionally, a matcher such as an impedance matched and passive components (e.g. filters, etc.) for a single frequency may not be required or may not be used, and particularly, the matcher may not be required because a voltage is directly applied to the chamber 20.

Figure 8:
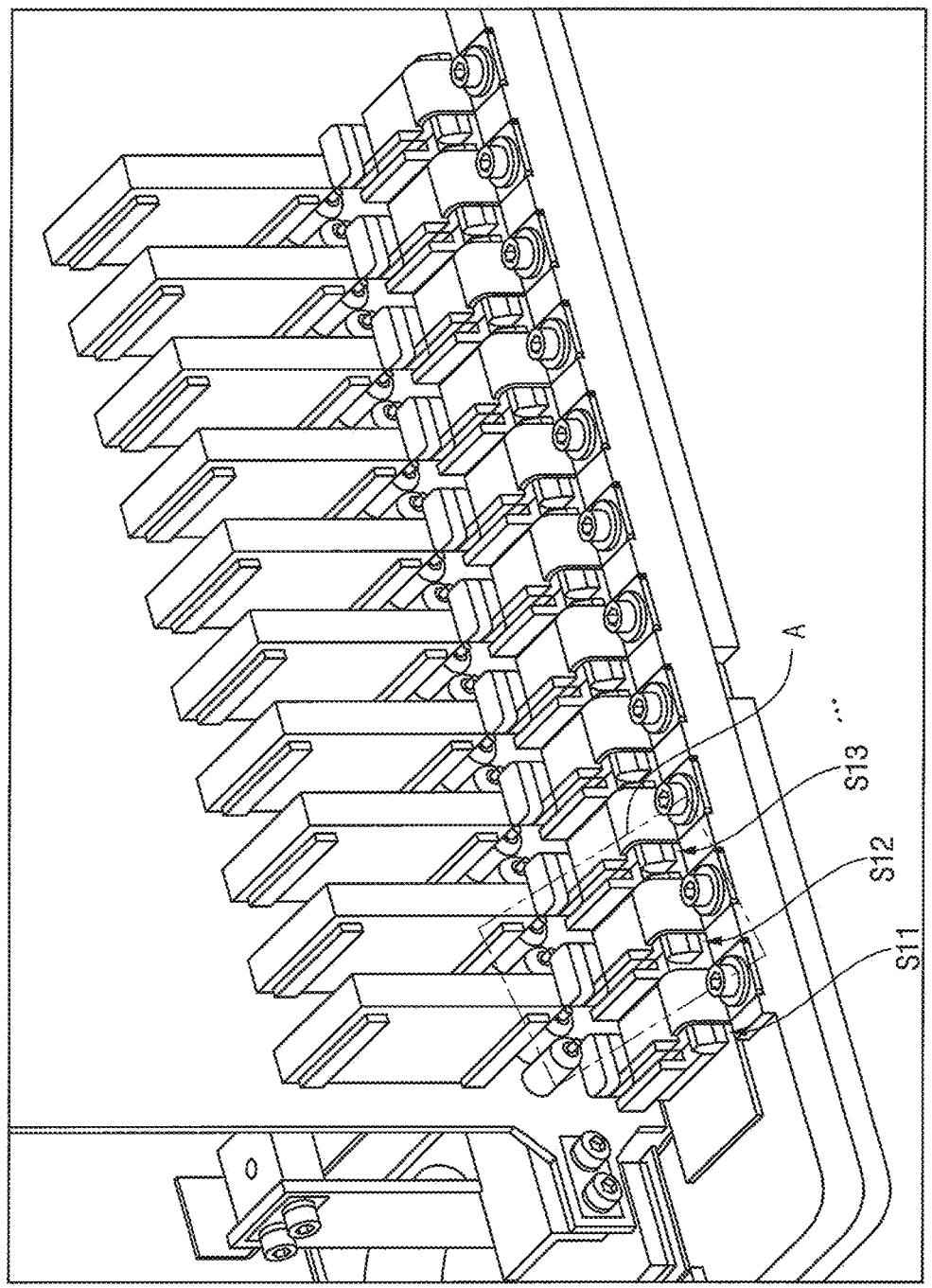
FIGS. 8, 9 and 10 are diagrams illustrating a variable frequency and non-sinusoidal power generator according to some example embodiments.
Figure 9:
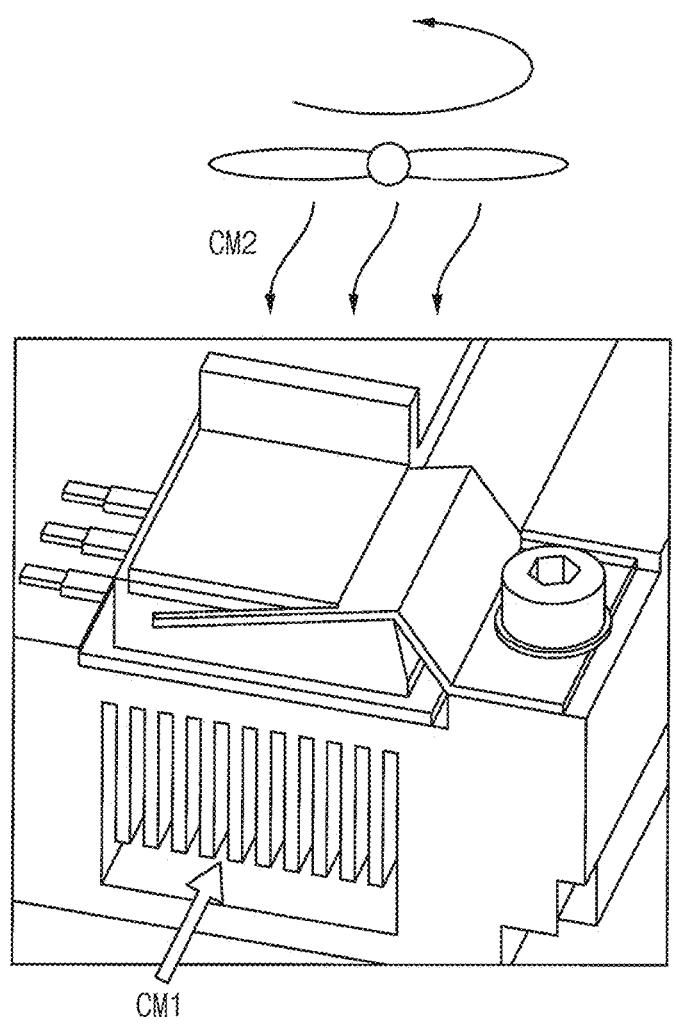
Figure 10:
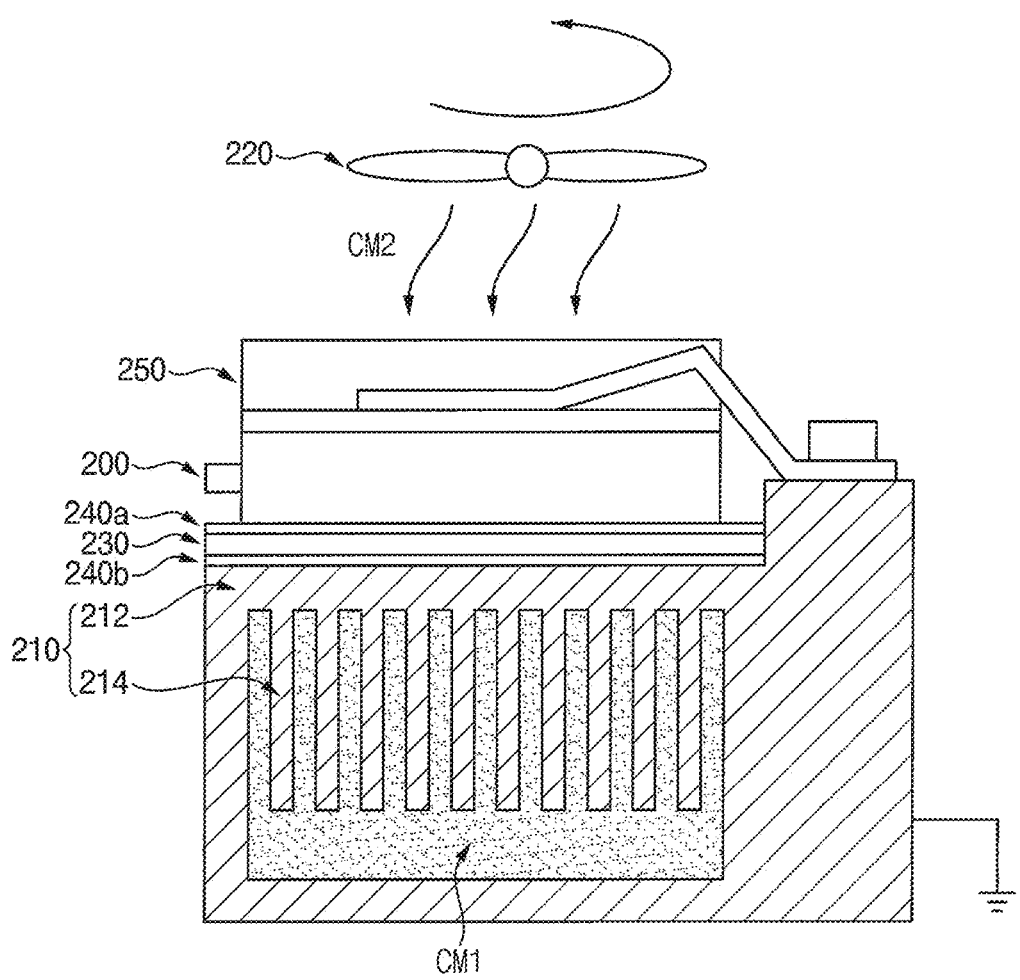

FIGS. 8, 9 and 10 are diagrams illustrating a variable frequency and non-sinusoidal power generator according to some example embodiments.

FIG. 8 is a perspective view of an arrangement of the plurality of switches or power elements (e.g., the plurality of pulse control switches and the plurality of slope control switches) included in the variable frequency and non-sinusoidal power generator. For example, FIG. 8 illustrates an example of an arrangement of the first switches included in the first control circuit 112. FIG. 9 is an enlarged perspective view of a part "A" in FIG. 8, and a first cooling system or first cooling means CM1 and a second cooling system or second cooling means CM2 for cooling the plurality of switches are also illustrated in FIG. 9. FIG. 10 is a cross-sectional view of the switch and the first and second cooling means CM1 and CM2 in FIG. 9.

Referring to FIG. 8, the first switches S11, S12, S13, . . . may be sequentially disposed (e.g., serially disposed) along one direction.

To distribute the high voltage and to distribute the generated heat, the power elements (e.g., the first switches S11, S12, S13, . . . ) may be implemented in a series connection manner. To simultaneously turn on the power elements, a passive balancing scheme may be applied.

If the switching speed of the power element is increased depending on the increase in frequency, the heat generation may increase in proportion to the frequency. For example, if the frequency is increased about 8 times from about 100 kHz to about 800 kHz, the heat generation may also increase about 8 times. Thus, to more stably operate without damage to the power element, it may be necessary or desirable to manage the temperature below a specific temperature during operation, and a technology for distributing the heat from the power element and a high-performance cooling technology may be required or utilized. To distribute the heat, the plurality of power elements may be connected in series and may be turned on at the same time. For example, the output voltage may have a voltage level of about several hundred V to several tens of kV, and since a single power element cannot endure heat due to power loss when operating at about several hundred kHz, the heat may be distributed by connecting the plurality of power elements in series.

Alternatively or additionally, to reduce parasitic inductance causing distortion to the waveform, the first switches S11, S12, S13, . . . may be arranged on a straight line.

Although not illustrated in FIG. 8, as with the first switches S11, S12, S13, . . . , each of the second switches S21 to S2N included in the second control circuit 114, the third switches S31 to S3N included in the third control circuit 116, the fourth switches S41 to S4N included in the fourth control circuit 118, the fifth switches S51 to S5N included in the fifth control circuit 122, the sixth switches S61 to S6N included in the sixth control circuit 124, the seventh switches S71 to S7N included in the seventh control circuit 126, and the eighth switches S81 to S8N included in the eighth control circuit 128 may also be sequentially disposed in one direction.

Referring to FIGS. 9 and 10, a variable frequency and non-sinusoidal power generator includes a switch (or power element) 200, a first cooling system or first cooling means CM1 and a second cooling system or second cooling means CM2. The variable frequency and non-sinusoidal power generator may further include a cold plate 210, a fan 220, a thermal pad 230, thermal pastes 240a and 240b, and a heat sink 250.

The switch 200 may be one of the plurality of pulse control switches and the plurality of slope control switches included in the pulse module circuit 110 and the slope module circuit 120. For example, the switch 200 may be the switch S12 among the first switches S11, S12, S13, . . . included in the first control circuit 112 in FIG. 8. For example, the switch 200 may operate with a high voltage of about several kV.

The first cooling means CM1 may be disposed at (or on) a first side of the switch 200, e.g., at a first side of the plurality of pulse control switches and the plurality of slope control switches. The second cooling means CM2 may be disposed at a second side opposite to the first side of the switch 200, e.g., at a second side opposite to the first side of the plurality of pulse control switches and the plurality of slope control switches. For example, the first side may be a lower side of the switch 200, and the second side may be an upper side of the switch 200.

The first and second cooling means CM1 and CM2 may have a cooling function for temperature control. The heat generated from the switch 200 may be reduced and the temperature of the variable frequency and non-sinusoidal power generator may be reduced by the first and second cooling means CM1 and CM2. To increase the cooling performance, the variable frequency and non-sinusoidal power generator may be implemented using the double side cooling in which the cooling means CM1 and CM2 are disposed at both sides (e.g., the upper and lower sides) with respect to the switch 200.

In some example embodiments, the first and second cooling means CM1 and CM2 may be different types of cooling means. For example, the first cooling means CM1 may include or be based on or have a tubing for or have flowing water, and the second cooling means CM2 may include or be based on or have flowing air and may include, for example, a fan. The cooling performance may be improved, e.g. may be maximized using the forced air at the top and using the water cooling at the bottom. However, some example embodiments are not limited thereto. Alternatively, the second cooling means CM2 may include or be based on or have flowing water or may include at least one of various other cooling means, such as but not limited to other coolants such as various refrigerants.

The cold plate 210 may be disposed at the first side of the switch 200 (e.g., disposed under the switch 200), and may be disposed between the switch 200 and the first cooling means CM1. The cold plate 210 may provide a space for supplying the first cooling means CM1, and the first cooling means CM1 may be stored and maintained in the cold plate 210. For example, the cold plate 210 may be connected to a ground voltage.

The cold plate 210 may include a plate part 212 on which the switch 200 is disposed, and a plurality of fin structures 214 protruding from the plate part 212. The contact area with the first cooling means CM1 may be increased by the plurality of fin structures 214, and thus the performance and/or efficiency of heat transfer may be improved.

The fan 220 may be disposed at the second side of the switch 200 (e.g., disposed on the switch 200). The second cooling means CM2, e.g. the second cooling system, may be supplied by the fan 220.

The thermal pad 230 may be disposed at the first side of the switch 200 (e.g., disposed under the switch 200), and may be disposed between the switch 200 and the cooling plate 210. The thermal pad 230 may include a material having a withstand voltage of several kV or more. For example, the thermal pad 230 may include aluminum nitride (AlN) having a thermal conductivity of about 170 W/m·K or more and an insulation voltage of about 14 kV or more.

The thermal paste 240a may be disposed between the switch 200 and the thermal pad 230, and the thermal paste 240b may be disposed between the thermal pad 230 and the cooling plate 210.

The heat sink 250 may be disposed at the second side of the switch 200 (e.g., disposed on the switch 200), and may be disposed between the switch 200 and the fan 220. For example, the heat sink 250 may be fixed by a clip type.

In some example embodiments, the cooling performance of the first and second cooling means CM1 and CM2 may be controlled depending on the frequency of the bias power By. For example, when the frequency of the bias power BV increases, the cooling performance of the first and second cooling means CM1 and CM2 may be increased and/or improved. For example, the cooling performance may be increased by increasing an amount of water (e.g., the first cooling means CM1), and/or a circulation speed of water, etc., and/or by increasing the rotation speed of the fan 220 for supplying the air (e.g., the second cooling means CM2).

The variable frequency and non-sinusoidal power generator according to some example embodiments may be implemented as illustrated in FIGS. 8, 9 and 10. Since the variable frequency and non-sinusoidal power generator is implemented using the double side cooling, the heat generation by the frequency change (e.g., increase) may be reduced, and the temperature control may be more efficiently performed.

FIGS. 11A, 11B, 12A, 12B, 13, 14, 15, 16, 17 and 18 are diagrams for describing an operation of a variable frequency and non-sinusoidal power generator according to some example embodiments.

Figure 11A:
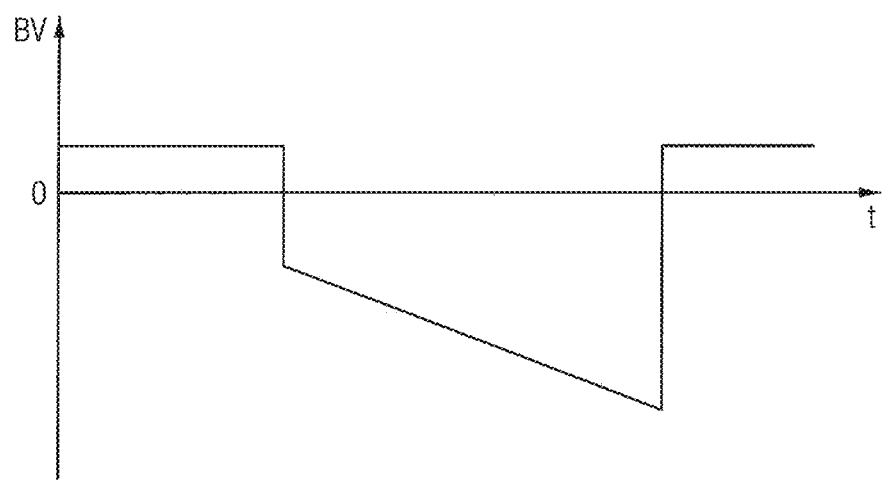
FIGS. 11A, 11B, 12A, 12B, 13, 14, 15, 16, 17 and 18 are diagrams for describing an operation of a variable frequency and non-sinusoidal power generator according to some example embodiments.
Figure 11B:
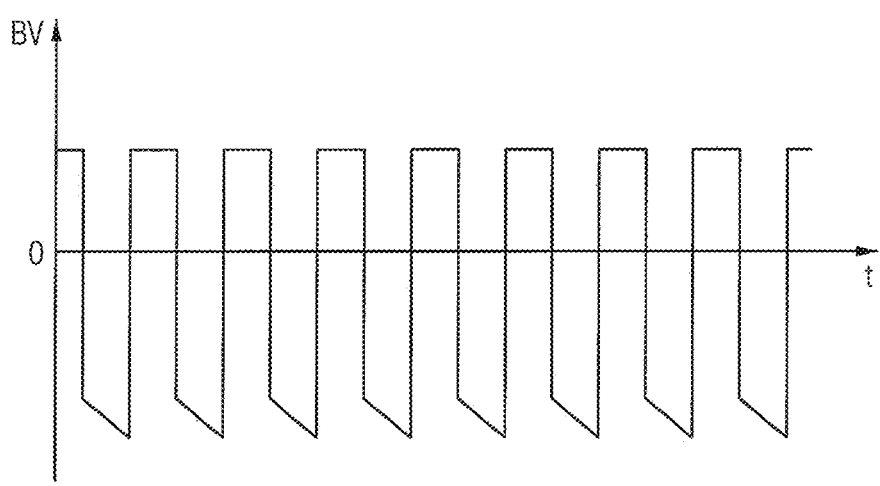

Referring to FIGS. 11A and 11B, a voltage waveform of the bias power BV that is generated by the variable frequency and non-sinusoidal power generator according to some example embodiments and is applied to the lower electrode 40 is illustrated.

FIG. 11A illustrates an example where the bias power BV has a first frequency (e.g. a first fundamental frequency), and FIG. 11B illustrates an example where the bias power BV has a second frequency (e.g. a second fundamental frequency) higher than the first frequency. The slope of the variable voltage level in the ramp interval T3 may be the same in examples of FIGS. 11A and 11B. For example, the first frequency may be about 100 kHz, and the second frequency may be about 800 kHz. For example, as will be described with reference to FIGS. 16 and 17, the frequency of the bias power BV may be changed for each step in a process of manufacturing a semiconductor device (e.g., in the same process), and the frequency of the bias power BV may be changed in real time during the process.

Figure 12A:
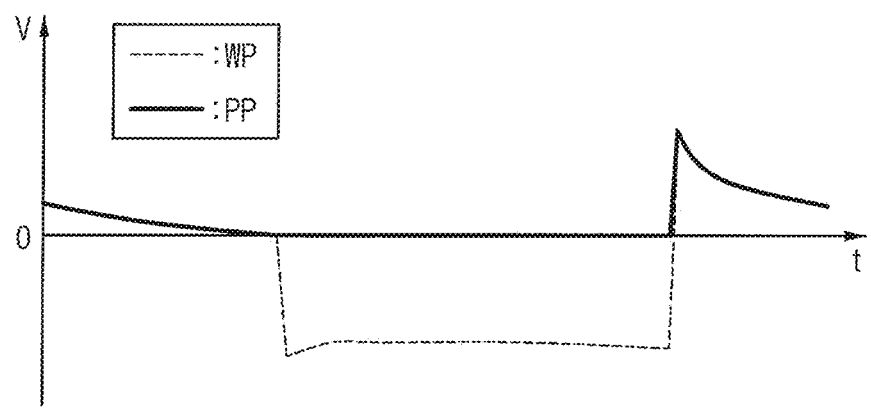
Figure 12B:
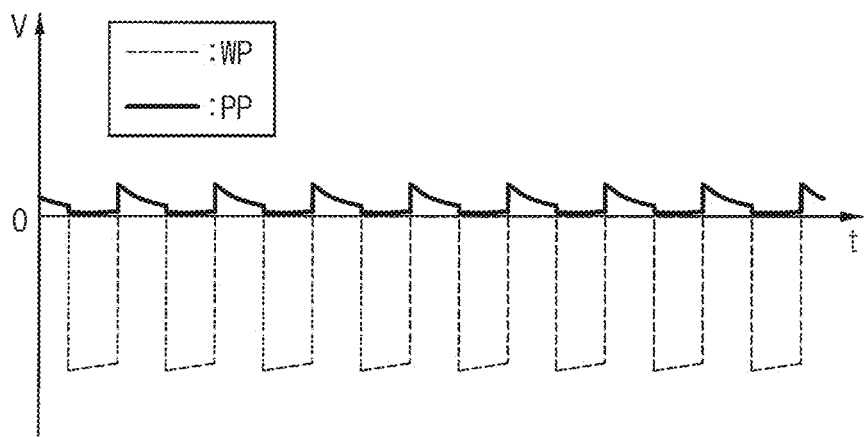

Referring to FIGS. 12A and 12B, a wafer potential WP (e.g., a voltage) on the substrate W induced by the bias power BV of FIGS. 11A and 11B and a plasma potential PP in the plasma space P of the chamber 20 are illustrated.

The bias power BV may be self-biased under the influence of the electrostatic chuck 30 disposed at the lower side and a plasma sheath disposed at the upper side to form the wafer potential WP having a negative offset. A sheath potential may correspond to a potential difference between the wafer potential WP and the plasma potential PP, and ions, such as reactive ions, incident on the substrate W may be controlled depending on the sheath potential. Alternatively or additionally, the wafer potential WP and the plasma potential PP may be different depending on the frequency of the bias power By.

Figure 13:
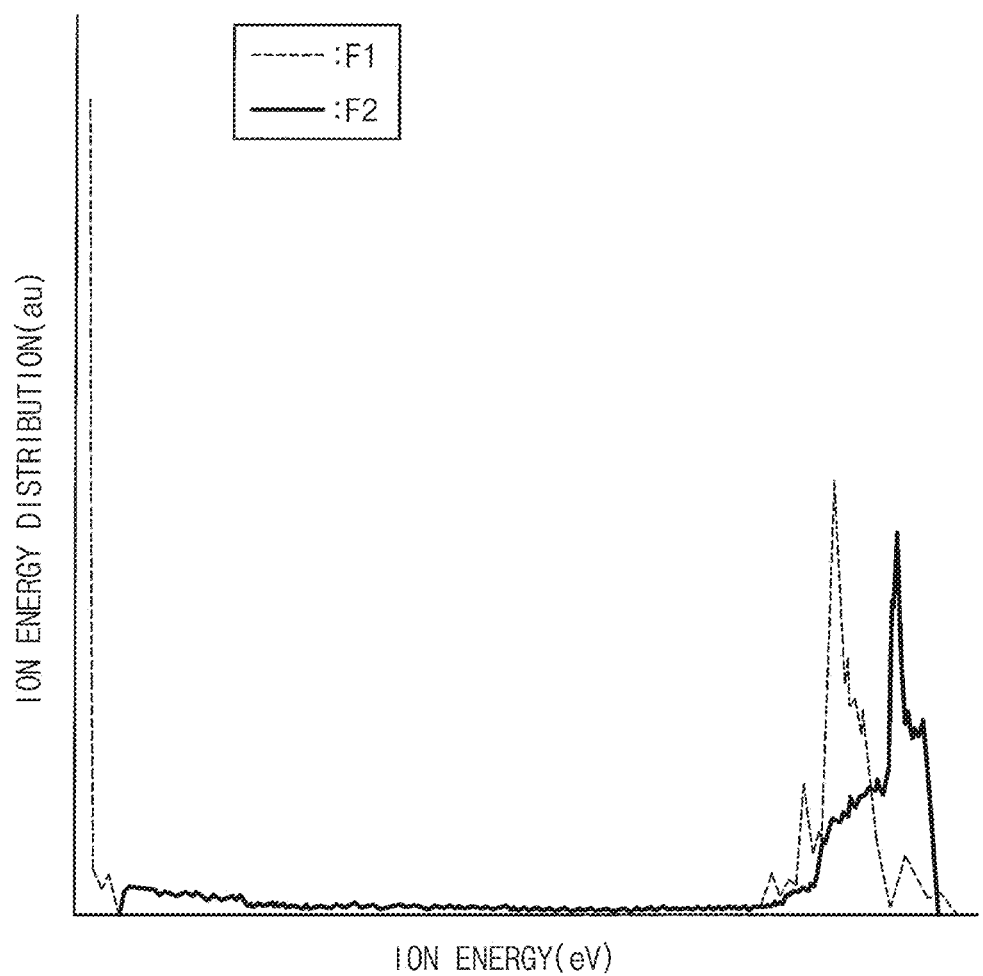

Referring to FIG. 13, an ion energy by the bias power BV of FIGS. 11A and 11B is illustrated. In FIG. 13 and subsequent figures, F1 may correspond to the first frequency (e.g. first low fundamental frequency) of FIG. 11A, and F2 may correspond to the second frequency (e.g. second larger fundamental frequency) of FIG. 11B.

The ion energy may be determined by the sheath potential, which is the potential difference between the wafer potential WP and the plasma potential PP, and the frequency of the bias power By. As illustrated in FIG. 13, the profile of the ion energy may be adjusted depending on the frequency of the bias power By. For example, as the frequency of the bias power BV increases, a central value of the ion energy may increase.

Figure 14:
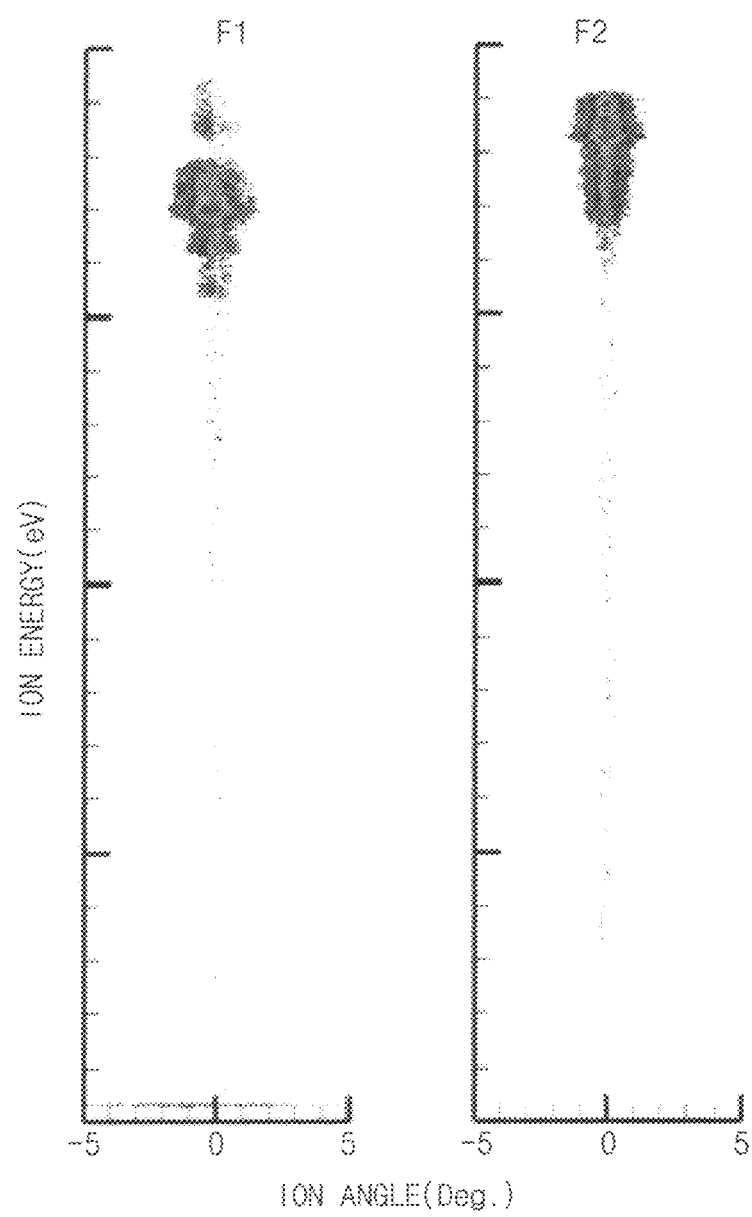

Referring to FIG. 14, an ion incident angle by the bias power BV of FIGS. 11A and 11B is illustrated.

Typically, a relatively high ion energy may have a small incident angle, and a relatively low ion energy may have a large incident angle. In a wafer having patterns, as the incident angle is smaller, the ions may be implanted narrower and/or deeper; for example, there may be a higher amount of anisotropy and/or a deeper potential aspect ratio with a smaller incident angle. As illustrated in FIG. 14, the ion incident angle may also be adjusted depending on the frequency of the bias power By.

Figure 15:
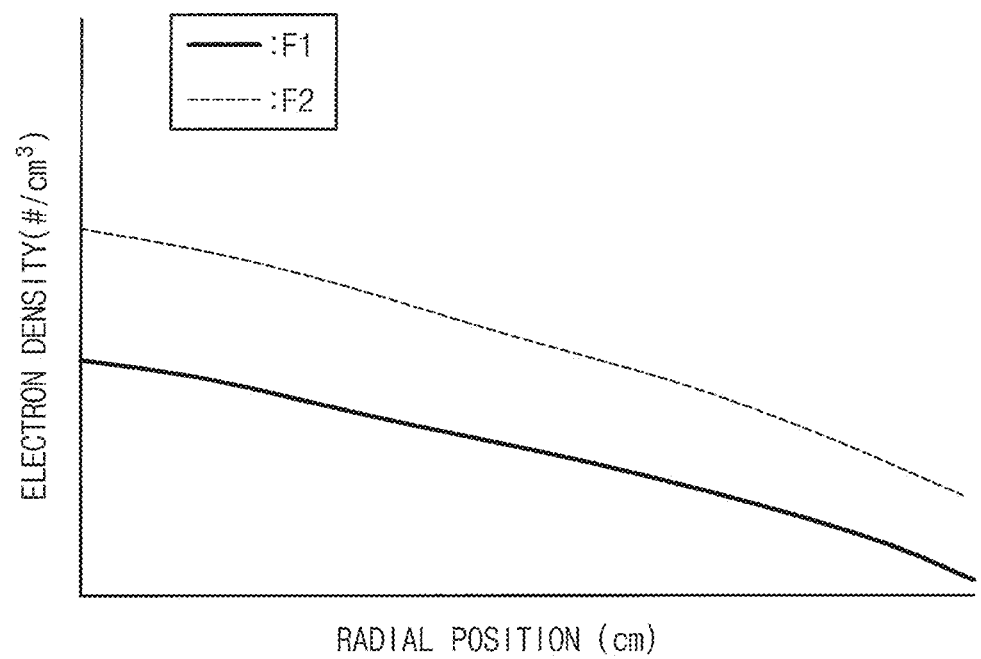

Referring to FIG. 15, a plasma density in the radial direction of the wafer by the bias power BV of FIGS. 11A and 11B is illustrated. As a radial position is smaller, it may be closer to a center of the wafer.

When the frequency of the bias power BV increases, it can be seen that the plasma density is relatively increased at the second frequency F2 compared to the first frequency F1, and at the center of the wafer compared to the outermost part of the wafer. The etching rate at the center of the wafer may be increased by increasing the frequency of the bias power By. For example, the plasma density in the radial direction of the wafer may be controlled by adjusting the frequency of the bias power BV, and the etching distribution in the radial direction of the entire wafer may be controlled by controlling the plasma density.

Figure 16:
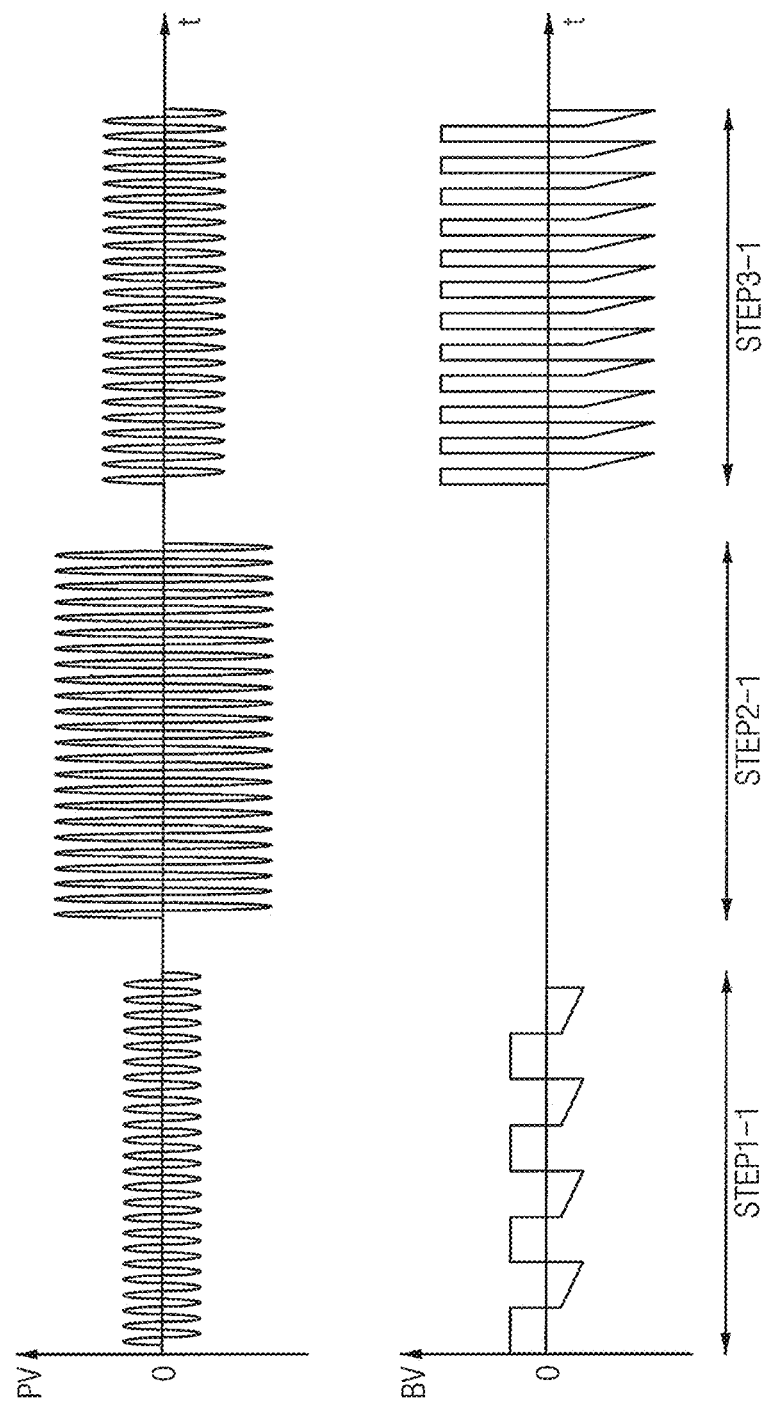
Figure 17:
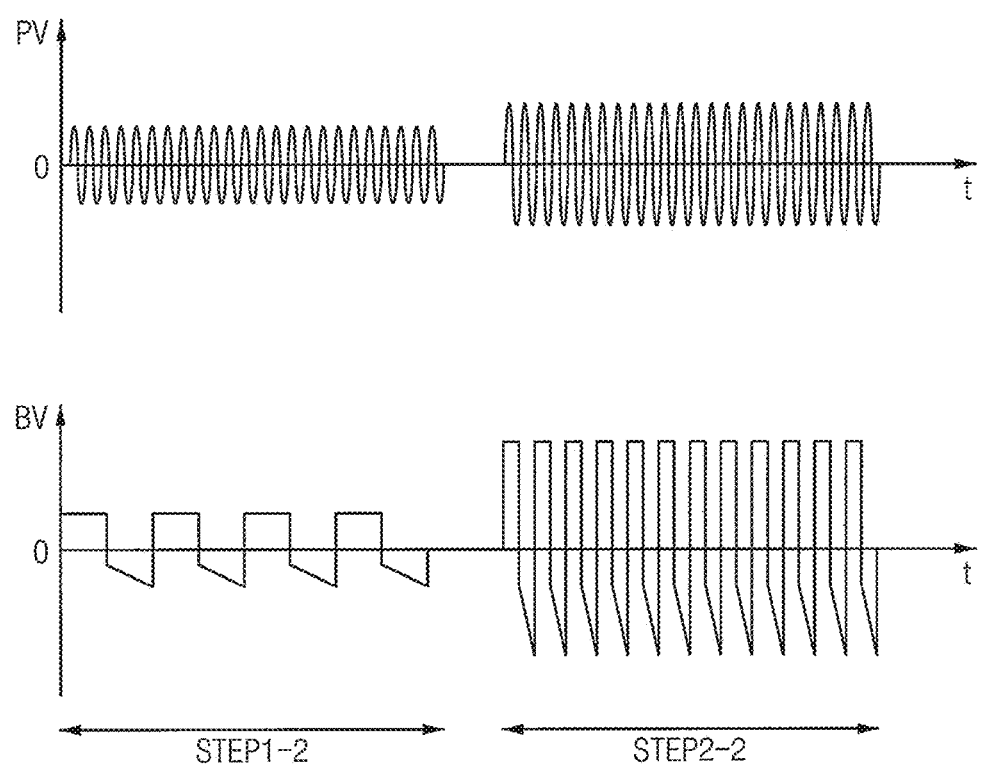

Referring to FIGS. 16 and 17, the plasma power PV and the bias power BV that are applied to the plasma processing apparatus in the process of manufacturing the semiconductor device are illustrated.

The process of manufacturing the semiconductor device may include various steps based on a plurality of recipes, and one process may include a plurality of steps. FIG. 16 illustrates an example where the process includes three steps STEP1-1, STEP2-1 and STEP3-1, and FIG. 17 illustrates an example where the process includes two steps STEP1-2 and STEP2-2.

In an example of FIG. 16, the first step STEP1-1 may be or may include a step of removing oxides and/or process by-products, the second step STEP2-1 may be or may include a step of protecting the etching side, and the third step STEP3-1 may be or may include a step of etching to a narrow and deep portion. The first step STEP1-1 may be referred to as a break through step, the second step STEP2-1 may be referred to as an oxidation step, and the third step STEP3-1 may be referred to as a main etching step.

In some example embodiments, during the first step STEP1-1, the bias power supply BV may be activated to have a first frequency and a first amplitude. During the second step STEP2-1, the bias power BV may be deactivated. During the third step STEP3-1, the bias power BV may be activated to have a second frequency different from the first frequency and a second amplitude different from the first amplitude. For example, the bias power BV having a relatively low frequency and a small amplitude may be used in the first step STEP1-1 to increase the etching for the outer part of the wafer/substrate W, and the bias power BV having a relatively high frequency and a large amplitude may be used in the third step STEP3-1 to improve the etching of the center of the wafer/substrate W. For example, the frequency of the bias power BV may be changed in real time during the process.

The plasma power PV may have different amplitudes during the first step STEP1-1, the second step STEP2-1, and the third step STEP3-1, but the frequency of the plasma power PV may be fixed.

In an example of FIG. 17, the first step STEP1-2 may be or may include a step of removing oxides or process by-products, and the second step STEP2-2 may be or may include a step of etching to a narrow and deep portion. The first step STEP1-2 and the second step STEP2-2 may correspond to the first step STEP1-1 and the third step STEP3-1 in FIG. 16, respectively.

In some example embodiments, during the first step STEP1-2, the bias power supply BV may have the first frequency and the first amplitude. During the second step STEP2-2, the bias power BV may have the second frequency and the second amplitude. The plasma power PV may have different amplitudes and the fixed frequency during the first step STEP1-2 and the second step STEP2-2.

In some example embodiments, as described with reference to FIGS. 4 through 7, the frequency of the bias power BV may be changed by adjusting lengths of the pulse interval T1, the first transition interval T2, the ramp interval T3 and the second transition interval T4 based on the plurality of pulse control signals PC and the plurality of slope control signals SC.

In some example embodiments, the amplitude of the bias power BV may be changed based on the first and second current control signals CC1 and CC2. For example, based on the first current control signal CC1, the amount of the first input current IS1 generated from the first current source 111 may be changed, and the fixed voltage level in the pulse interval T1 may be changed from a first fixed voltage level to a second fixed voltage level. Based on the second current control signal CC2, the amount of the second input current IS2 generated from the second current source 121 may be changed, and the variable voltage level in the ramp interval T3 may be changed from a first variable voltage level to a second variable voltage level.

Figure 18:
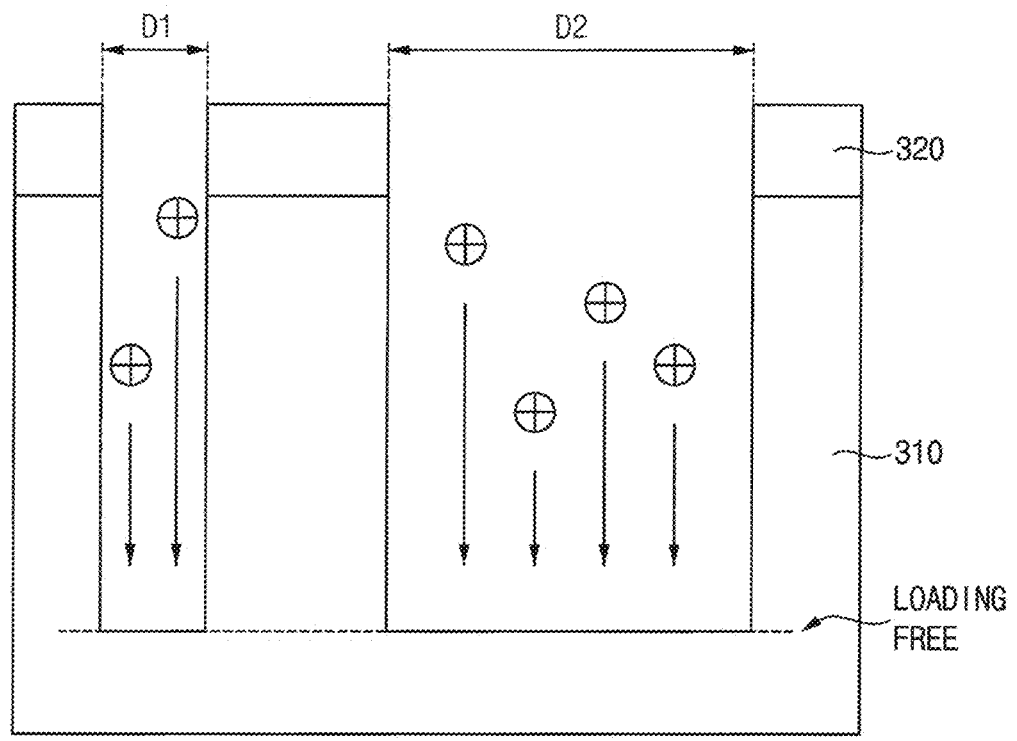

Referring now to FIG. 18, an etching process on a semiconductor device using the plasma processing apparatus is illustrated.

The semiconductor device may include a semiconductor layer 310 and a mask layer 320. For example, the semiconductor layer 310 may include Si, and the mask layer 320 may include a nitride and/or an organic material such as a photoresist and/or $SiO_2$.

In some example embodiments, the mask layer 320 may include a plurality of openings. For example, the plurality of openings may have different diameters/widths/lengths. The etching process may be performed to form a first opening having a first diameter/width D1 and a second opening having a second diameter/width D2.

When the bias power BV having the variable frequency and the non-sinusoidal waveform is used or applied according to some example embodiments, the ion energy having a relatively narrow single peak (or mono-peak) may be formed, as illustrated in FIGS. 13 and 14. Thus, when the etching process is performed using the bias power BV, the straightness (or directivity or anisotropy) of ions may be improved, an etching profile of the semiconductor device may be improved, and the bowing or loss of anisotropy may be reduced. The ions may reach a narrow and deep region due to the high straightness of ions, and thus a difference between a depth of a widely-etched area and a depth of a narrowly-etched area (e.g., a difference between a depth of the first opening and a depth of the second opening), for example, an intra cell (IC) loading, may be removed. For example, the IC loading may refer to non-uniform patterns formed in a cell region of the semiconductor device caused by or related to different etching rates between different pattern widths, or the IC loading may be a phenomenon that an etching rate depends on pattern widths. Alternatively or additionally, the plasma density in the radial direction of the wafer may be controlled by the frequency change, and thus the etching distribution in the radial direction of the wafer may be controlled.

FIGS. 19A, 19B, 19C, 19D, 19E, 19F and 19G are diagrams for describing an operation of a variable frequency and non-sinusoidal power generator according to some example embodiments.

Referring to FIGS. 19A, 19B, 19C, 19D, 19E, 19F and 19G, at least one of the slope of the variable voltage level in the ramp interval T3, a ratio of the length of the pulse interval T1 and the length of the ramp interval T3, and a ratio of a length of a first interval in which the bias power BV is activated and a length of a second interval in which the bias power BV is deactivated may be additionally adjusted.

In some embodiments, as illustrated in FIGS. 19A, 19B, 19C and 19D, a wafer potential WP induced on the surface of the substrate W may be controlled by the negative slope in the ramp interval T3. The slope of the variable voltage level in the ramp interval T3 may be selected such that the wafer potential WP induced on the surface of the substrate W has a desired/predetermined constant value. For example, a graph P3 of FIG. 19C may be selected from among graphs P1, P2, P3 and P4 of FIGS. 19A, 19B, 19C and 19D. The slope of the variable voltage level in the ramp interval T3 may be adjusted to thereby prevent the surface of the substrate W from being charged positively with positive ions.

Figure 19A:
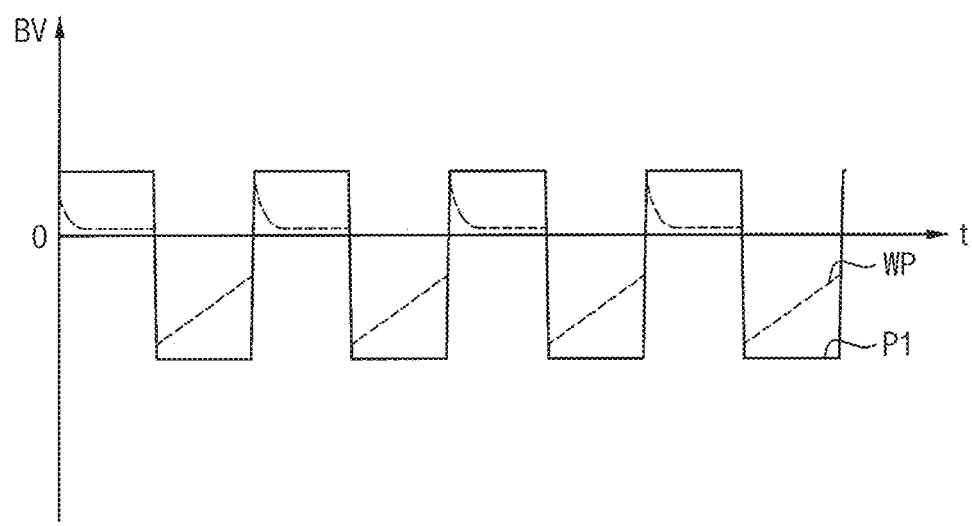
FIGS. 19A, 19B, 19C, 19D, 19E, 19F and 19G are diagrams for describing an operation of a variable frequency and non-sinusoidal power generator according to some example embodiments.
Figure 19B:
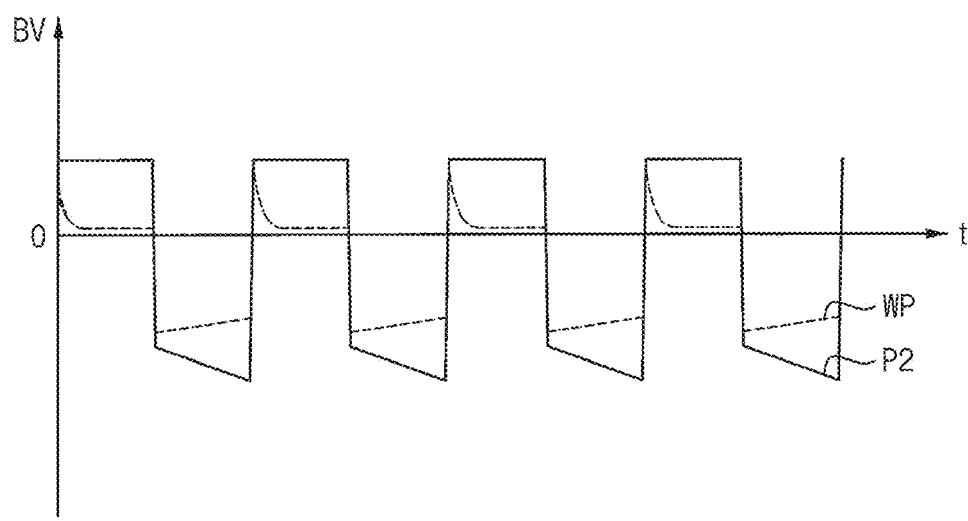
Figure 19C:
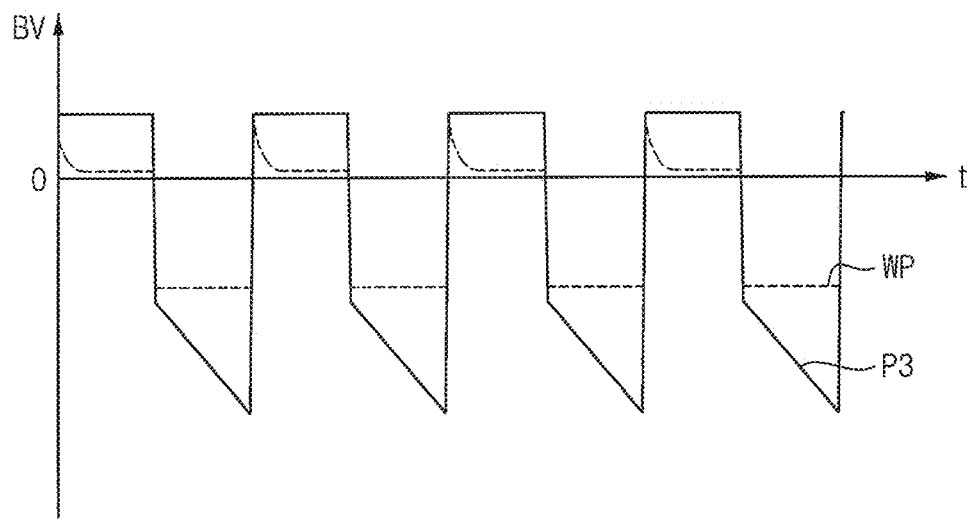
Figure 19D:
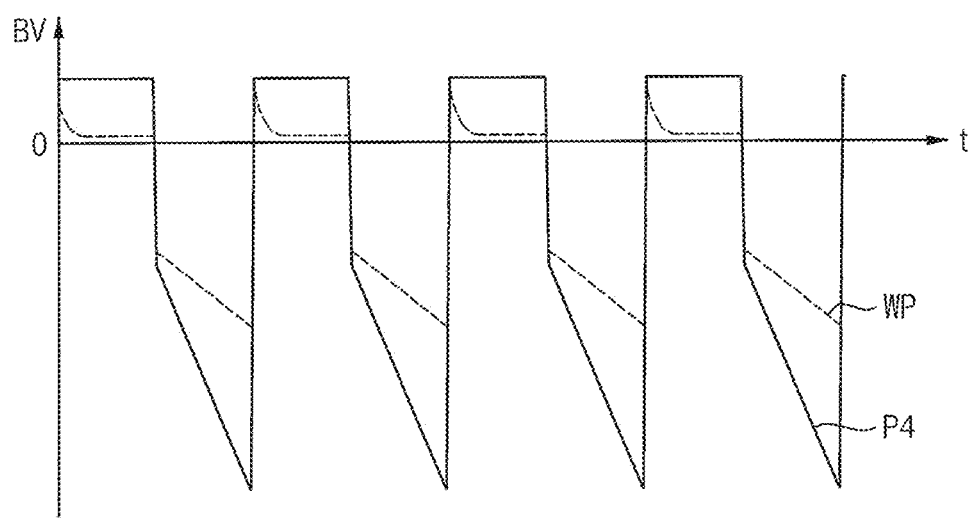
Figure 19E:
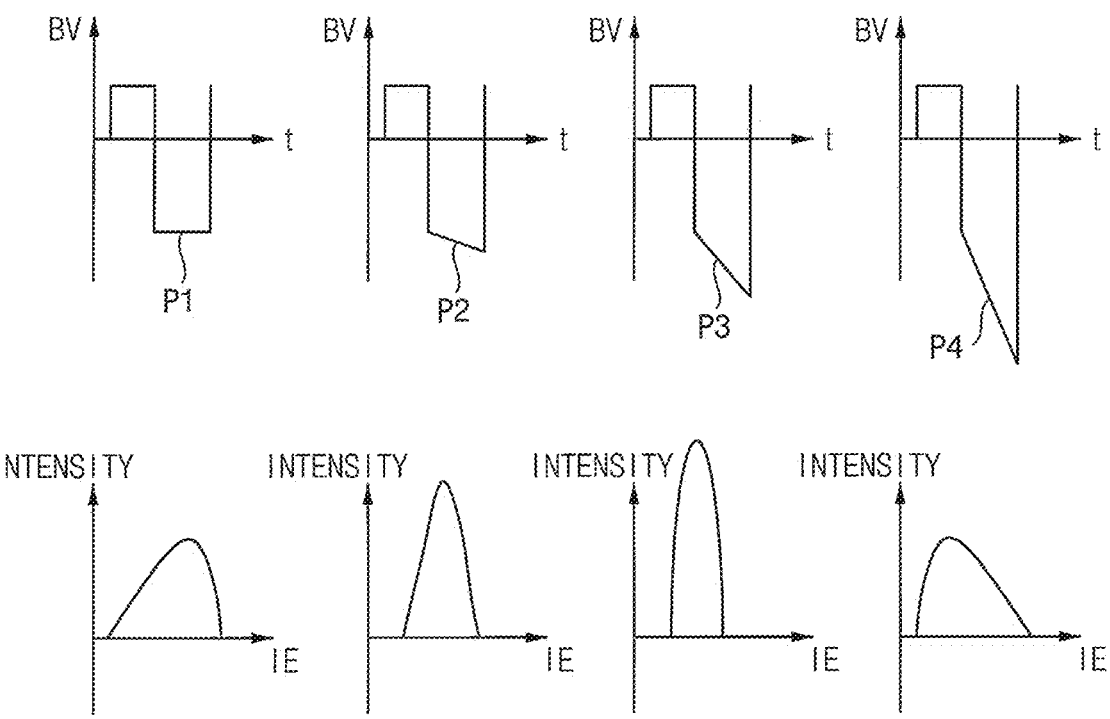

In some example embodiments, as illustrated in FIG. 19E, an ion energy distribution on the substrate W may be controlled by the negative slope in the ramp interval T3. The slope of the variable voltage level in the ramp interval T3 (e.g., the graph P3) may be selected such that the ion energy distribution having a narrow single peak. The slope of the variable voltage level in the ramp interval T3 may be adjusted to thereby control the ion energy distribution on the surface of the substrate W.

Figure 19F:
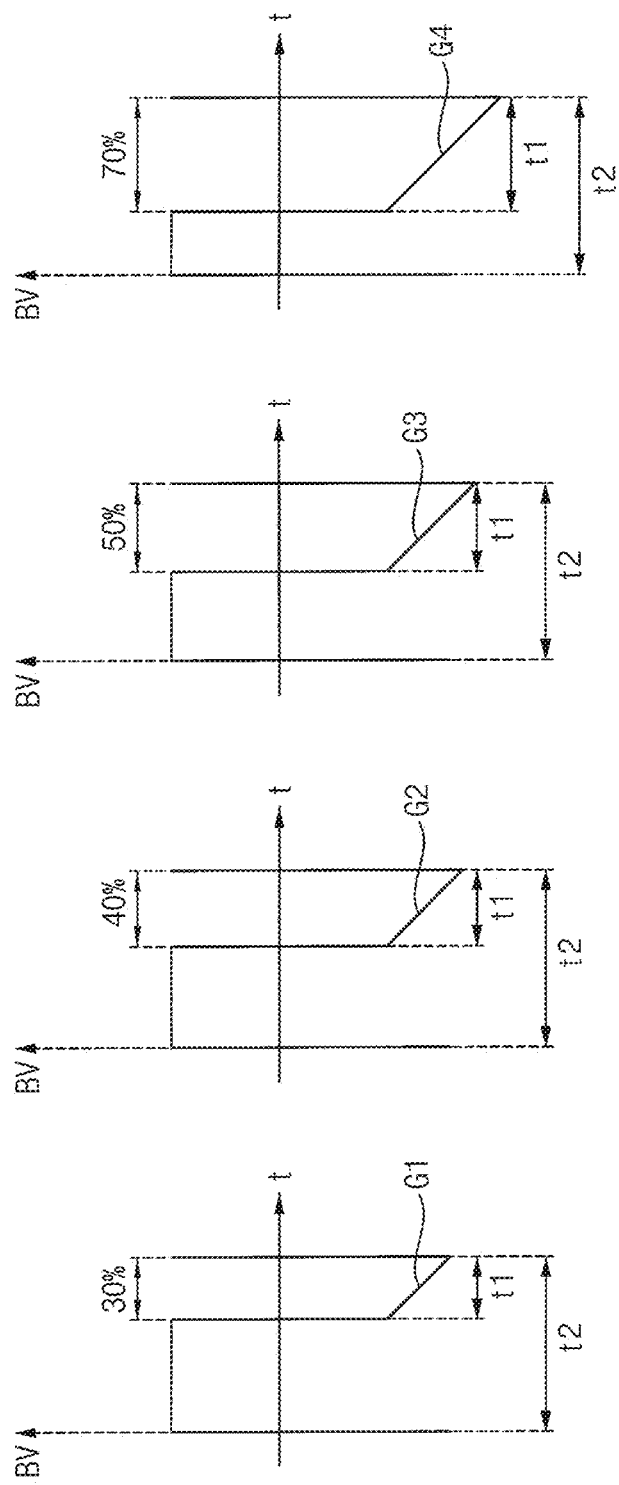

In some example embodiments, as illustrated in FIG. 19F, the ratio of the length of the pulse interval T1 and the length of the ramp interval T3 in the bias power BV, e.g., a time ratio (e.g., t1/t2) of the ramp interval T3 to a cycle of the bias power BV within one period/cycle of the bias power BV, or simply the duration ratio of the ramp interval T3 to a cycle of the bias power BV, may be adjusted. For example, the duration ratio of the ramp interval T3 may be adjusted while the slope of the variable voltage level in the ramp interval T3 is maintained at the determined value. For example, the duration ratio of the ramp interval T3 to the corresponding period/cycle may be adjusted within a range of about 20% to about 80%. For example, a graph G1 may represent a case that the duration ratio of the ramp interval T3 is adjusted about 30%, a graph G2 may represent a case that the duration ratio of the ramp interval T3 is adjusted about 40%, a graph G3 may represent a case that the duration ratio of the ramp interval T3 is adjusted about 50%, and a graph G4 may represent a case that the duration ratio of the ramp interval T3 is adjusted about 70%.

Figure 19G:
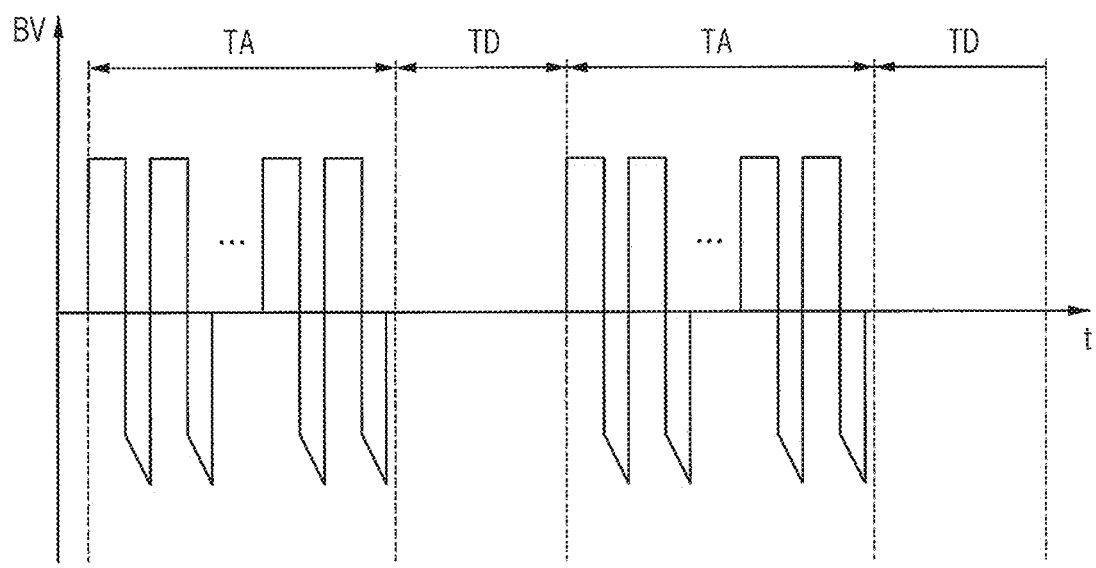

In some example embodiments, as illustrated in FIG. 19G, a ratio of a length of a first interval TA in which the bias power BV is activated and a length of a second interval TD in which the bias power BV is deactivated, e.g., an on/off duty ratio of the bias power BV within a process period/cycle, may be adjusted. For example, the ratio of the length of the first interval TA and the length of the second interval TD may be adjusted within a range of about 5% to about 95%. The ratio of the length of the first interval TA and the length of the second interval TD may be adjusted to thereby remove efficiently a gas and process by-products within a pattern (opening) formed during an etching process.

Figure 20:
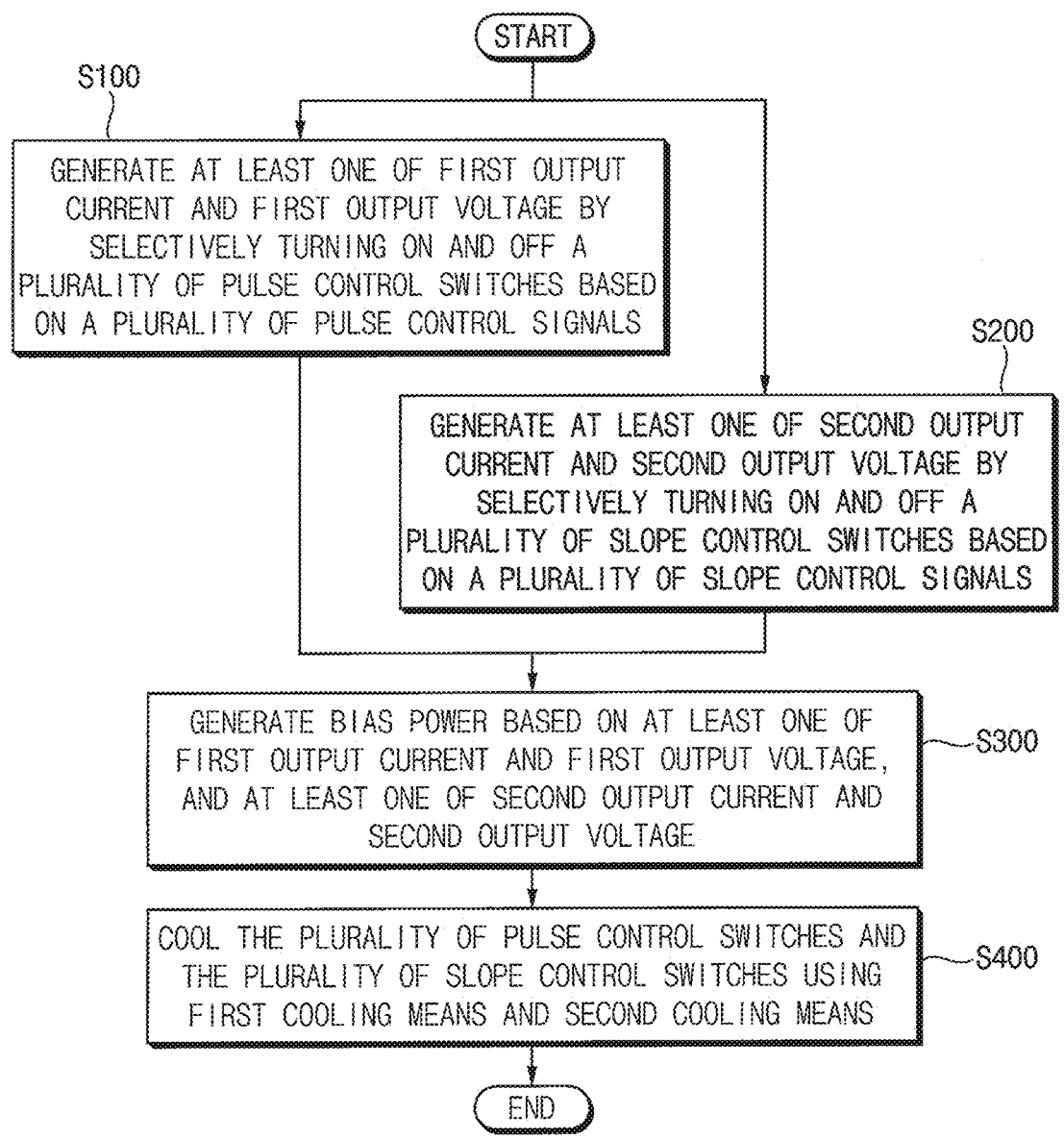
FIG. 20 is a flowchart illustrating a method of generating a variable frequency and non-sinusoidal power according to some example embodiments.

FIG. 20 is a flowchart illustrating a method of generating a variable frequency and non-sinusoidal power according to some example embodiments.

Referring to FIGS. 4 through 10 and 20, in a method of generating a variable frequency and non-sinusoidal power according to some example embodiments, at least one of the first output current IO1 and the first output voltage is generated by selectively turning on and off the plurality of pulse control switches based on the plurality of pulse control signals PC (step S100). At least one of the second output current IO2 and the second output voltage by selectively turning on and off the plurality of slope control switches based on the plurality of slope control signals SC (step S200). The bias power BV is generated based on at least one of the first output current IO1 and the first output voltage, and at least one of the second output current IO2 and the second output voltage (step S300). Steps S100, S200 and S300 may be performed by the pulse module circuit 110, the slope module circuit 120 and the plasma load 140, respectively, and may be substantially simultaneously performed.

As described above, the bias power BV has the variable frequency and the non-sinusoidal waveform. For example, the frequency of the bias power BV may be changed by adjusting the turn-on times, the turn-off times and/or the switching timings (or switching speeds) of the plurality of pulse control switches and the plurality of slope control switches. Alternatively or additionally, the frequency of the bias power BV may be changed for each step in the process of manufacturing the semiconductor device, and the frequency of the bias power BV may be changed in real time during the process. Alternatively or additionally, the amplitude of the bias power BV may also be changed based on the first and second current control signals CC1 and CC2.

The plurality of pulse control switches and the plurality of slope control switches are cooled using the first cooling system/first cooling means CM1 and the second system/second cooling means CM2 (step S400). The cooling performance may be improved using the double side cooling, and the heat generation by the frequency increase may be efficiently reduced.

Figure 21:
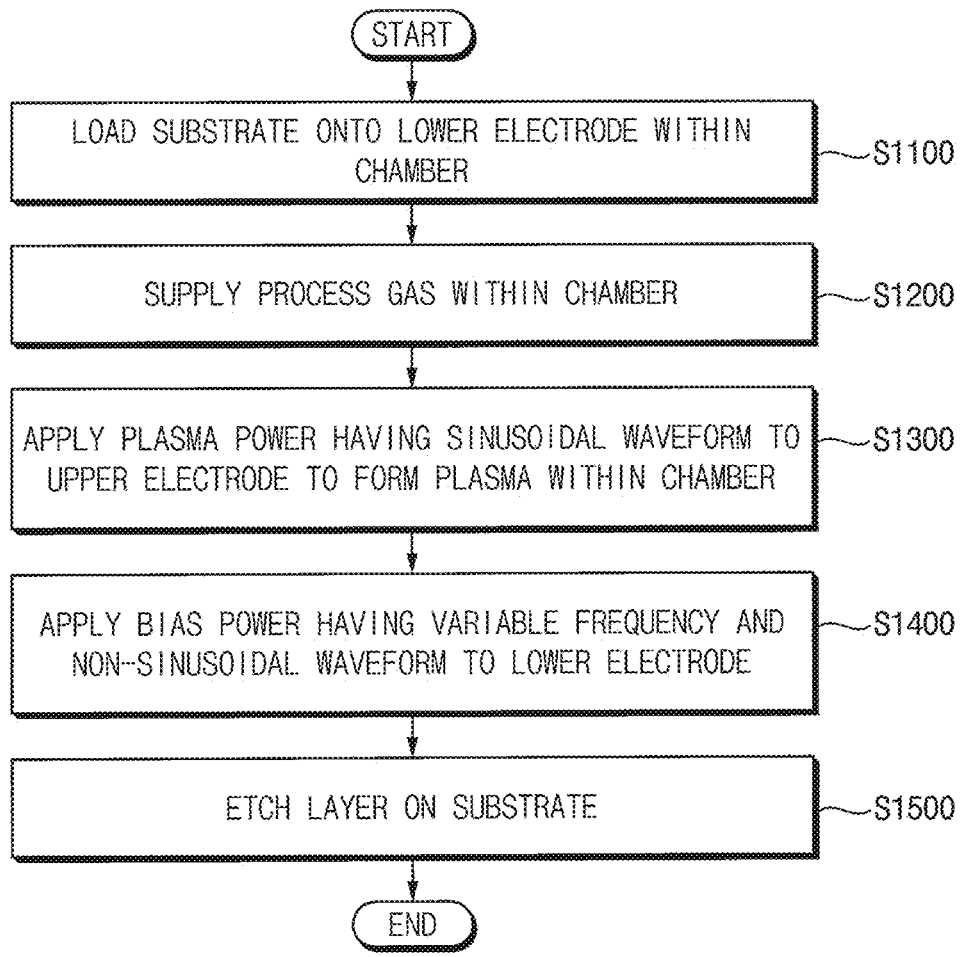
FIG. 21 is a flowchart illustrating a method of performing plasma processing according to some example embodiments.

FIG. 21 is a flowchart illustrating a method of performing plasma processing according to some example embodiments.

Referring to FIGS. 1, 2 and 21, in a method of performing plasma processing according to some example embodiments, the substrate W is loaded onto the lower electrode 40 within the chamber 20 (step S1100). A process gas is supplied within the chamber 20 (step S1200).

For example, the substrate W such as the semiconductor wafer may be loaded on the electrostatic chuck 30 of the substrate stage within the chamber 20. The process gas (for example, an etching process gas) may be introduced into the chamber 20 through the gas supply lines 60a and 60b, and then a pressure of the chamber 20 may be controlled to a desired/predetermined vacuum level by the gas exhaust unit 26.

After that, the plasma power PV is applied by the sinusoidal power generator 51 to the upper electrode 50 to form the plasma within the chamber 20 (step S1300). The plasma power PV has the sinusoidal waveform. The bias power BV is applied by the variable frequency and non-sinusoidal power generator 41 to the lower electrode 40 (step S1400). The bias power BV has the variable frequency and the non-sinusoidal waveform. An etching process is performed on the layer on the substrate W (step S1500). Step S1400 may be performed based on the method of generating the variable frequency and non-sinusoidal power according to some example embodiments described with reference to FIG. 20.

For example, when the plasma power PV having the fixed frequency (for example, about 13.56 MHz) and the sinusoidal waveform is applied from the sinusoidal power generator 51 to the upper electrode 50, an electromagnetic field induced by the upper electrode 50 may be applied to a source gas within the chamber 20 to generate the plasma. For example, when the bias power BV having the variable frequency and the non-sinusoidal waveform is applied from the variable frequency and non-sinusoidal power generator 41 to the lower electrode 40, the ion energy distribution having a relatively narrow single peak may be generated on the surface of the substrate W. Thus, a controllability of an etching profile may be improved. For example, the layer on the substrate W may include at least one of a metal layer, a metal nitride layer, an insulation layer, a semiconductor layer, etc. Alternatively, the layer on the substrate W may be omitted, and the substrate W may be a layer to be etched, for example during an etch of a silicon substrate.

Figure 22:
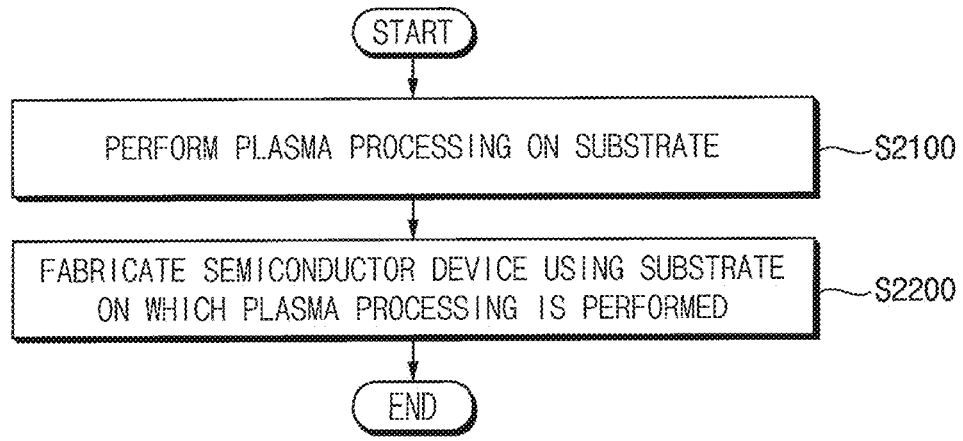
FIG. 22 is a flowchart illustrating a method of manufacturing a semiconductor device according to some example embodiments.

FIG. 22 is a flowchart illustrating a method of manufacturing a semiconductor device according to some example embodiments.

Referring to FIGS. 1 and 22, in a method of manufacturing a semiconductor device according to some example embodiments, the plasma processing is performed on the substrate (step S2100). The semiconductor device is fabricated using the substrate on which the plasma processing is performed (step S2200). Step S2100 may be performed based on the method of performing the plasma processing according to some example embodiments described with reference to FIG. 21.

Inventive concepts may be embodied as a system, method, computer program product, and/or a computer program product embodied in one or more computer readable medium(s) having computer readable program code embodied thereon. The computer readable program code may be provided to a processor of a general purpose computer, special purpose computer, or other programmable data processing apparatus. The computer readable medium may be a computer readable signal medium or a computer readable storage medium. The computer readable storage medium may be any tangible medium that can contain or store a program for use by or in connection with an instruction execution system, apparatus, or device. For example, the computer readable medium may be a non-transitory computer readable medium.

Inventive concepts may be applied to various semiconductor devices and manufacturing processes of the semiconductor devices. For example, inventive concepts may be applied to the manufacturing processes of the semiconductor devices such as a memory device, a processing device, etc. For example, inventive concepts may be applied to the manufacturing processes of systems including the memory device and the processing device such as a personal computer (PC), a server computer, a data center, a workstation, a mobile phone, a smart phone, a tablet computer, a laptop computer, a personal digital assistant (PDA), a portable multimedia player (PMP), a digital camera, a portable game console, a music player, a camcorder, a video player, a navigation device, a wearable device, an internet of things (IoT) device, an internet of everything (IoE) device, an e-book reader, a virtual reality (VR) device, an augmented reality (AR) device, a robotic device, a drone, etc.

Any of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The foregoing is illustrative of some example embodiments and is not to be construed as limiting thereof. Although some example embodiments have been described, those of ordinary skill in the art will readily appreciate that many modifications are possible in example embodiments without materially departing from the teachings and/or advantages of the example embodiments. Accordingly, all such modifications are intended to be included within the scope of example embodiments as defined in the claims. Therefore, it is to be understood that the foregoing is illustrative of various example embodiments and is not to be construed as limited to any specific example embodiments disclosed, and that modifications to example embodiments, as well as other example embodiments, are intended to be included within the scope of the appended claims. Still further none of the example embodiments are necessarily mutually exclusive to one another. For example some example embodiments may include features described with reference to one or more figures, and may also include other features described with reference to one or more other figures.

What is claimed is:

1. A variable frequency and non-sinusoidal power generator comprising:

a pulse module circuitry including a plurality of pulse control switches, and configured to generate at least one first output current or first output voltage, the generating the at least one first output current or first output voltage by selectively turning on and off the plurality of pulse control switches based on a plurality of pulse control signals, at least some of the plurality of pulse control switches being in series;

a slope module circuitry including a plurality of slope control switches, and configured to generate at least one second output current or second output voltage, the generating the at least one second output current or second output voltage by selectively turning on and off the plurality of slope control switches based on a plurality of slope control signals, at least some of the plurality of slope control switches being in series;

a first cooling system at a first side of the plurality of pulse control switches and the plurality of slope control switches; and a second cooling system at a second side opposite to the first side of the plurality of pulse control switches and the plurality of slope control switches, wherein the variable frequency and non-sinusoidal power generator generates a bias power having a variable frequency and a non-sinusoidal waveform based on the plurality of pulse control signals, the plurality of slope control signals, at least one of the first output current or the first output voltage, and at least one of the second output current or the second output voltage.

2. The variable frequency and non-sinusoidal power generator of claim 1, wherein:

the bias power has a voltage waveform that repeats every period, and the period includes a pulse interval in which the bias power has a first fixed voltage level that is greater than a reference voltage level, a ramp interval in which the bias power has a first variable voltage level that is less than the reference voltage level and decreases with a constant slope, a first transition interval for changing the pulse interval to the ramp interval, and a second transition interval for changing the ramp interval to the pulse interval.

3. The variable frequency and non-sinusoidal power generator of claim 2, wherein the variable frequency and non-sinusoidal power generator changes a frequency of the bias power by adjusting lengths of the pulse interval, the ramp interval, the first transition interval, and the second transition interval, the adjusting the lengths based on the plurality of pulse control signals and the plurality of slope control signals.

4. The variable frequency and non-sinusoidal power generator of claim 2, wherein the pulse module circuit includes:
a first current source connected between a first node and a second node;
a first control circuitry connected between the first node and a first output node, and including first switches and first diodes, the first switches turning on and off based on a first pulse control signal;
a second control circuitry connected between the first node and a second output node, and including second switches and second diodes, the second switches turning on and off based on a second pulse control signal;
a third control circuitry connected between the first output node and the second node, and including third switches and third diodes, the third switches turning on and off based on a third pulse control signal; and
a fourth control circuitry connected between the second output node and the second node, and including fourth switches and fourth diodes, the fourth switches turning on and off based on a fourth pulse control signal.

5. The variable frequency and non-sinusoidal power generator of claim 4, wherein:
the first switches and the first diodes are alternately arranged between the first node and the first output node and are connected in series,
the second switches and the second diodes are alternately arranged between the first node and the second output node and are connected in series,
the third switches and the third diodes are alternately arranged between the first output node and the second node and are connected in series, and
the fourth switches and the fourth diodes are alternately arranged between the second output node and the second node and are connected in series.

6. The variable frequency and non-sinusoidal power generator of claim 5, wherein the slope module circuitry includes:
a second current source connected between a third node and a fourth node;
a fifth control circuitry connected between the third node and the first output node, and including fifth switches and fifth diodes, the fifth switches turning on and off based on a first slope control signal;
a sixth control circuitry connected between the third node and the second output node, and including sixth switches and sixth diodes, the sixth switches turning on and off based on a second slope control signal;
a seventh control circuitry connected between the first output node and the fourth node, and including seventh switches and seventh diodes, the seventh switches turning on and off based on a third slope control signal; and
an eighth control circuitry connected between the second output node and the fourth node, and including eighth switches and eighth diodes, the eighth switches turning on and off based on a fourth slope control signal.

7. The variable frequency and non-sinusoidal power generator of claim 6, wherein:
the fifth switches and the fifth diodes are alternately arranged between the third node and the first output node and are connected in series,
the sixth switches and the sixth diodes are alternately arranged between the third node and the second output node and are connected in series,
the seventh switches and the seventh diodes are alternately arranged between the first output node and the fourth node and are connected in series, and
the eighth switches and the eighth diodes are alternately arranged between the second output node and the fourth node and are connected in series.

8. The variable frequency and non-sinusoidal power generator of claim 6, wherein:
during the pulse interval, the second switches, the fourth switches, the sixth switches and the eighth switches simultaneously turn on, and the first switches, the third switches, the fifth switches and the seventh switches simultaneously turn off,
during the first transition interval, the second switches, the third switches, the sixth switches and the eighth switches simultaneously turn on, and the first switches, the fourth switches, the fifth switches and the seventh switches simultaneously turn off,
during the ramp interval, the first switches, the third switches, the sixth switches and the seventh switches simultaneously turn on, and the second switches, the fourth switches, the fifth switches and the eighth switches simultaneously turn off, and
during the second transition interval, the first switches, the fourth switches, the fifth switches and the seventh switches simultaneously turn on, and the second switches, the third switches, the sixth switches and the eighth switches simultaneously turn off.

9. The variable frequency and non-sinusoidal power generator of claim 6, wherein:
based on a first current control signal, the variable frequency and non-sinusoidal power generator changes an amount of a first input current generated from the first current source, and the variable frequency and non-sinusoidal power generator changes the first fixed voltage level in the pulse interval to a second fixed voltage level, and
based on a second current control signal, the variable frequency and non-sinusoidal power generator changes an amount of a second input current generated from the second current source, and the variable frequency and non-sinusoidal power generator changes the first variable voltage level in the ramp interval to a second variable voltage level.

10. The variable frequency and non-sinusoidal power generator of claim 9, wherein the amount of the first input current is greater than the amount of the second input current.

11. The variable frequency and non-sinusoidal power generator of claim 2, wherein the variable frequency and non-sinusoidal power generator is configured to additionally adjust at least one of a slope of the first variable voltage level, a ratio of a length of the pulse interval to a length of the ramp interval, or a ratio of a length of a first interval in which the bias power is activated to a length of a second interval in which the bias power is deactivated.

12. The variable frequency and non-sinusoidal power generator of claim 1, further comprising:
a control signal generator circuitry configured to generate the plurality of pulse control signals and the plurality of slope control signals.

13. The variable frequency and non-sinusoidal power generator of claim 1, wherein the first cooling system and the second cooling system are different types of cooling system.

14. The variable frequency and non-sinusoidal power generator of claim 13, wherein the first cooling system includes water, and the second cooling system includes at least one of air or water.

15. The variable frequency and non-sinusoidal power generator of claim 1, further comprising:
a cold plate between the first cooling system and at least one of the plurality of pulse control switches or the plurality of slope control switches.

16. The variable frequency and non-sinusoidal power generator of claim 15, wherein the cold plate includes:
a plate part on which the plurality of pulse control switches and the plurality of slope control switches are arranged; and
a plurality of fin structures protruding from the plate part.

17. The variable frequency and non-sinusoidal power generator of claim 15, further comprising:
a thermal pad between the cold plate and at least one of the plurality of pulse control switches or the plurality of slope control switches.

18. A plasma processing apparatus comprising:
a chamber;
a substrate stage configured to support a substrate within the chamber, and including a lower electrode;
an upper electrode over the lower electrode to face the substrate;
a sinusoidal power generator configured to apply a plasma power to the upper electrode to form plasma within the chamber, the plasma power having a sinusoidal waveform; and
a variable frequency and non-sinusoidal power generator configured to apply a bias power to the lower electrode, the bias power having a variable frequency and a non-sinusoidal waveform, and
wherein the variable frequency and non-sinusoidal power generator includes,
a pulse module circuitry including a plurality of pulse control switches, and configured to generate at least one of a first output current or a first output voltage by selectively turning on and off the plurality of pulse control switches, the turning on and off the plurality of pulse control switches based on a plurality of pulse control signals, at least some of the plurality of pulse control switches arranged in series,
a slope module circuitry including a plurality of slope control switches, and configured to generate at least one of a second output current or a second output voltage by selectively turning on and off the plurality of slope control switches, the turning on and off the plurality of pulse control switches based on a plurality of slope control signals, at least some of the plurality of slope control switches arranged in series,
a first cooling system at a first side of the plurality of pulse control switches and the plurality of slope control switches, and
a second cooling system at a second side opposite to the first side of the plurality of pulse control switches and the plurality of slope control switches, and
wherein the variable frequency and non-sinusoidal power generator is configured to generate the bias power based on the plurality of pulse control signals, the plurality of slope control signals, at least one of the first output current and the first output voltage, and at least one of the second output current and the second output voltage.

19. The plasma processing apparatus of claim 18, wherein:
during a first step in a process of manufacturing a semiconductor device, the bias power has a first frequency and a first amplitude, and
during a second step different from the first step in the process of manufacturing the semiconductor device, the bias power has a second frequency different from the first frequency and a second amplitude different from the first amplitude.

20. A variable frequency and non-sinusoidal power generator comprising:
a pulse module circuitry including a first current source and a plurality of pulse control switches, and configured to generate at least one of a first output current or a first output voltage by adjusting an amount of a first input current generated from the first current source based on a first current control signal and by selectively turning on and off the plurality of pulse control switches, the turning on and off the plurality of pulse control switches based on a plurality of pulse control signals, at least some of the plurality of pulse control switches arranged in series;
a slope module circuitry including a second current source and a plurality of slope control switches, and configured to generate at least one of a second output current or a second output voltage by adjusting an amount of a second input current generated from the second current source based on a second current control signal and by selectively turning on and off the plurality of slope control switches, the selectively turning on and off the plurality of slope control switches based on a plurality of slope control signals, at least some of the plurality of slope control switches being arranged in series;
a control signal generator circuitry configured to generate the first current control signal, the plurality of pulse control signals, the second current control signal, and the plurality of slope control signals;
a first cooling system at a first side of the plurality of pulse control switches and the plurality of slope control switches;
a second cooling system at a second side opposite to the first side of the plurality of pulse control switches and the plurality of slope control switches;
a cold plate including a plurality of fin structures, and arranged between the first cooling system and at least one of the plurality of pulse control switches and the plurality of slope control switches; and
a thermal pad between the cold plate and at least one of the plurality of pulse control switches and the plurality of slope control switches,
wherein the variable frequency and non-sinusoidal power generator is configured to generate a bias power having a variable frequency and a non-sinusoidal waveform based on the plurality of pulse control signals, the plurality of slope control signals, at least one of the first output current or the first output voltage, and at least one of the second output current or the second output voltage,
the bias power has a voltage waveform that repeats every period, and
the period includes a pulse interval in which the bias power has a first fixed voltage level that is greater than a reference voltage level, a ramp interval in which the bias power has a first variable voltage level that is less than the reference voltage level and decreases with a constant slope, a first transition interval for changing the pulse interval to the ramp interval, and a second transition interval for changing the ramp interval to the pulse interval.

* * * * *